United States Patent
Bergmann et al.

(10) Patent No.: US 9,601,673 B2
(45) Date of Patent: Mar. 21, 2017

(54) LIGHT EMITTING DIODE (LED) COMPONENTS INCLUDING LED DIES THAT ARE DIRECTLY ATTACHED TO LEAD FRAMES

(71) Applicant: Cree, Inc., Durham, NC (US)

(72) Inventors: Michael John Bergmann, Raleigh, NC (US); Colin Kelly Blakely, Franklinton, NC (US); Arthur Fong-Yuen Pun, Raleigh, NC (US); Jesse Colin Reiherzer, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/550,186

(22) Filed: Nov. 21, 2014

(65) Prior Publication Data
US 2016/0149104 A1    May 26, 2016

(51) Int. Cl.
*H01L 33/62* (2010.01)
*B23K 1/00* (2006.01)
(Continued)

(52) U.S. Cl.
CPC .............. *H01L 33/62* (2013.01); *B23K 1/00* (2013.01); *B23K 1/19* (2013.01); *B23K 35/262* (2013.01); *B23K 35/3033* (2013.01); *C22C 13/00* (2013.01); *C22C 19/03* (2013.01); *H01L 25/0753* (2013.01); *H01L 33/36* (2013.01); *H01L 33/486* (2013.01);
(Continued)

(58) Field of Classification Search
CPC ....... H01L 33/62; H01L 33/36; H01L 33/486; H01L 33/38; H01L 33/387; H01L 33/385; H01L 33/483
See application file for complete search history.

(56) References Cited

U.S. PATENT DOCUMENTS 6,396,082 B1 * 5/2002 Fukasawa ............... H01L 33/50
257/79
7,926,984 B2    4/2011 Su
(Continued)

FOREIGN PATENT DOCUMENTS

DE      101 17 890 A1    10/2002
WO   WO 2012/061182 A1    5/2012
(Continued)

OTHER PUBLICATIONS

International Search Report and Written Opinion of the International Searching Authority, Application No. PCT/IB15/58941, Feb. 19, 2016.
(Continued)

*Primary Examiner* — Scott B Geyer
*Assistant Examiner* — Brigitte Paterson
(74) *Attorney, Agent, or Firm* — Myers Bigel, P.A.

(57) ABSTRACT

A Light Emitting Diode (LED) component includes a lead frame and an LED that is electrically connected to the lead frame without wire bonds, using a solder layer. The lead frame includes a metal anode pad, a metal cathode pad and a plastic cup. The LED die includes LED die anode and cathode contacts with a solder layer on them. The metal anode pad, metal cathode pad, plastic cup and/or the solder layer are configured to facilitate the direct die attach of the LED die to the lead frame without wire bonds. Related fabrication methods are also described.

27 Claims, 16 Drawing Sheets

(51) Int. Cl.
| | |
|---|---|
| B23K 1/19 | (2006.01) |
| B23K 35/26 | (2006.01) |
| B23K 35/30 | (2006.01) |
| C22C 13/00 | (2006.01) |
| C22C 19/03 | (2006.01) |
| H01L 25/075 | (2006.01) |
| H01L 33/36 | (2010.01) |
| H01L 33/48 | (2010.01) |

(52) U.S. Cl.
CPC .............. *H01L 2224/16245* (2013.01); *H01L 2924/0002* (2013.01); *H01L 2933/0066* (2013.01)

(56) References Cited

U.S. PATENT DOCUMENTS

| | | |
|---|---|---|
| 8,110,437 B2 | 2/2012 | Waitl et al. |
| 8,368,100 B2 | 2/2013 | Donofrio et al. |
| 2003/0153108 A1* | 8/2003 | Durocher ................ H01L 23/13 438/26 |
| 2007/0236849 A1 | 10/2007 | Bono et al. |
| 2011/0031502 A1 | 2/2011 | Bergmann et al. |
| 2011/0177686 A1 | 7/2011 | Zeng et al. |
| 2012/0193660 A1 | 8/2012 | Donofrio et al. |
| 2012/0193662 A1 | 8/2012 | Donofrio et al. |
| 2012/0223433 A1 | 9/2012 | Jee et al. |
| 2013/0193453 A1* | 8/2013 | Donofrio ............ H01L 25/0753 257/88 |

FOREIGN PATENT DOCUMENTS

| | | |
|---|---|---|
| WO | WO 2012/080014 A1 | 6/2012 |
| WO | WO 2013/109774 A9 | 7/2013 |
| WO | WO 2013/116086 A1 | 8/2013 |
| WO | WO 2013/144858 A1 | 10/2013 |

OTHER PUBLICATIONS

Song et al., "The Microstructure of Eutectic Au—Sn Solder Bumps on Cu/Electroless Ni/Au", *Journal of Electronic Materials*, vol. 30, No. 9, Sep. 2001, pp. 1083-1087.
Cree, Inc., "Direct Attach DA1000™ LEDs" (Data Sheet: CPR3ES Rev. A, 2010), 5 pp.
Cree, Inc., "Direct Attach DA3547™ LEDs" (Data Sheet: CPR3EL Rev. D, 2010-2012), 5 pp.
Cree, Inc., "Direct Attach DA2432™ LEDs" (Data Sheet: CPR3FM Rev.-, 2011), 5 pp.
Cree, Inc., "Cree® XLamp® MX-6 LEDs" (Product Family Data Sheet: CLD-DS23 Rev 7C, 2009-2014), 12 pp.
Cree, Inc., "Cree® XLamp® ML-E LEDs" (Product Family Data Sheet: CLD-DS30 Rev 10A, 2010-2014), 27 pp.
Cree, Inc., "Cree® XLamp® MX-3 LEDs" (Product Family Data Sheet: CLD-DS28 Rev 5D, 2010-2014), 11 pp.

* cited by examiner

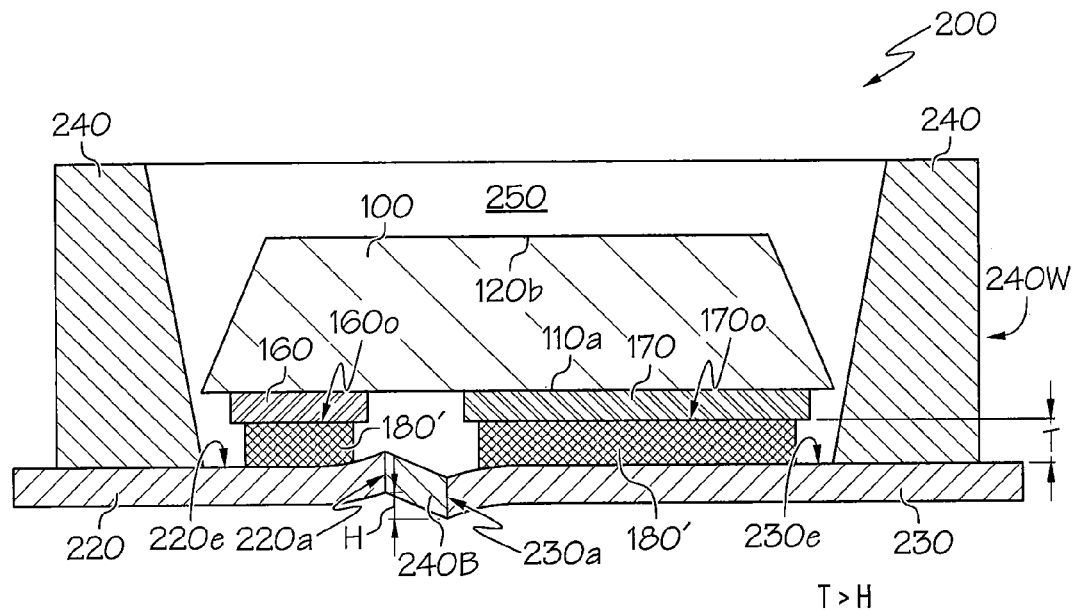
FIG. 18
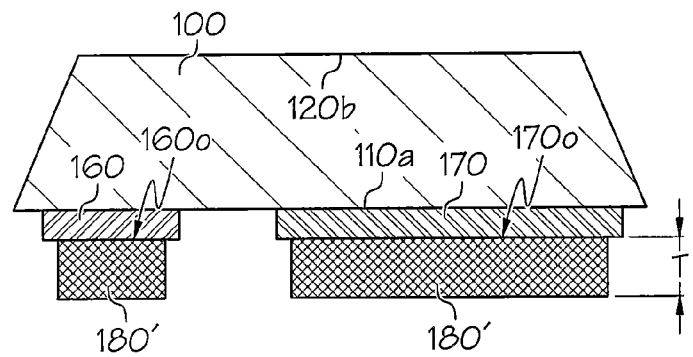
FIG. 19    T > H and
           T > 3 μm
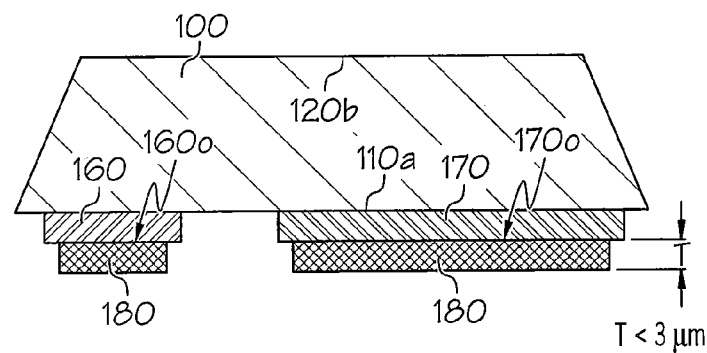
FIG. 20    T < 3 μm

LIGHT EMITTING DIODE (LED) COMPONENTS INCLUDING LED DIES THAT ARE DIRECTLY ATTACHED TO LEAD FRAMES

BACKGROUND

Various embodiments described herein relate to light emitting devices and assemblies and methods of fabricating the same, and more particularly, to Light Emitting Diodes (LEDs), assemblies thereof and fabrication methods therefor.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

An LED component provides a packaged LED die for mounting on a board, such as a Metal Core Printed Circuit Board (MCPCB), flexible circuit board and/or other printed circuit board, along with other electronic components, for example using Surface Mount Technology (SMT). An LED component generally includes an LED die and other packaging elements.

SMT is a method for producing electronic circuits in which the components are mounted or placed directly onto the surface of circuit boards. An electronic device so made may be called a Surface Mount Device (SMD). An SMT component is usually smaller than its through-hole counterpart. Simpler and faster automated assembly may also be provided, as well as other potential advantages. As such, SMT is increasingly being used in electronic component assembly.

SMDs often use lead frames as part of the SMD package. A lead frame is a metal structure inside a package that carries signals from the die to the outside. The die inside the package is typically glued to the lead frame and bond wires attach the die contacts to the lead frame leads using wire bonding techniques. The lead frame may then be molded in a plastic case, and the outside of the lead frame is cut off, thereby separating the leads. The lead frame itself may be manufactured by removing material from a flat plate of copper or copper-alloy, by etching, stamping and/or other techniques.

Lead frames are also now being used for low cost, high density SMD LED components. In these LED components, the lead frame includes a metal anode pad, a metal cathode pad and a plastic cup on the metal anode pad and the metal cathode pad that defines an exposed portion of the metal anode pad and an exposed portion of the metal cathode pad in the plastic cup. At least some portions of the plastic cup may be transparent, translucent, opaque and/or reflective, and the plastic cup may be formed of plastics, such as Epoxy Molding Compounds (EMCs) and/or silicone. An LED die is glued to the lead frame, and the anode and/or cathode contacts thereof are wire-bonded to the lead frame pads. The cup may then be filled with encapsulant, at least some portions of which may be transparent, translucent and/or reflective. The encapsulant may include wavelength conversion material, such as phosphor, therein.

LEDs are increasingly being used in lighting/illumination applications, with a goal being to provide a replacement for the ubiquitous incandescent light bulb. The cost of manufacturing LED dies may continue to decrease due to advances in microelectronic fabrication techniques. As such, the packaging the LED dies may assume a larger and larger cost of the LED component.

SUMMARY

A Light Emitting Diode (LED) component according to various embodiments described herein includes a lead frame and an LED die that is electrically connected to the lead frame without wire bonds. In some embodiments, the lead frame comprises a plastic cup, and the LED die is in the plastic cup and is electrically connected to the lead frame in the plastic cup. In some embodiments, the LED die anode and cathode contacts are directly attached to the lead frame using a solder layer.

More specifically, an LED component according to various embodiments described herein includes a lead frame that comprises a metal anode pad, a metal cathode pad and a plastic cup on the metal anode pad and the metal cathode pad that defines an exposed portion of the metal anode pad and an exposed portion of the metal cathode pad in the plastic cup. The LED component also includes an LED die that comprises first and second opposing faces and an anode contact and a cathode contact on the first face thereof, the anode and cathode contacts including outer faces remote from the LED die. The LED die is disposed in the plastic cup such that the outer face of the anode contact is closely spaced apart from the exposed portion of the metal anode pad and the outer face of the cathode contact is closely spaced apart from the exposed portion of the metal cathode pad. The LED component also includes a die attach layer that extends between the outer face of the anode contact and the exposed portion of the metal anode pad and between the outer face of the cathode contact and the exposed portion of the metal cathode pad. The die attach layer directly electrically connects the outer face of the anode contact to the exposed portion of the metal anode pad and directly electrically connects the outer face of the cathode contact to the exposed portion of the metal cathode pad.

In some embodiments, the plastic cup comprises silicone and the exposed portions of the anode and cathode pads are not coplanar.

According to some embodiments described herein, the metal anode pad, the metal cathode pad and/or the plastic cup are configured to facilitate the direct electrical connection of the outer face of the anode contact to the exposed portion of the metal anode pad and the direct electrical connection of the outer face of the cathode contact to the exposed portion of the metal cathode pad, by the die attach layer. Specifically, in some embodiments, adjacent ends of the metal anode pad and the metal cathode pad define a gap therebetween, wherein the plastic cup extends in the gap and also extends beyond non-adjacent ends of the metal anode pad and the metal cathode pad by a distance. The distance is larger than the gap. In some embodiments, the distance is at least 10% larger than the gap. In other embodiments, the distance is at least 30% larger than the gap.

Still other embodiments can configure the metal anode pad, the metal cathode pad and/or the plastic cup to facilitate direct electrical connection of the LED to the lead frame by configuring adjacent ends of the metal anode pad and the metal cathode pad to have different widths. In yet other embodiments, the plastic cup extends on opposite faces of the metal anode pad and/or the metal cathode pad. In still other embodiments, the lead frame further comprises a metal link that mechanically connects the metal anode pad to the metal cathode pad outside the plastic cup. The metal link may be configured to be sheared from the metal anode pad and/or the metal cathode pad, for example during component singulation. The metal link may also comprise a fusible metal.

In still other embodiments, the metal anode pad and the metal cathode pad include curved facing surfaces. In some embodiments, the curved facing surfaces comprise a plurality of line segments that form oblique and/or orthogonal angles therebetween. In other embodiments, the metal anode pad includes a metal finger that extends toward the metal cathode pad and the metal cathode pad includes a metal finger that extends toward the metal anode pad.

Some of the embodiments described above that include facing surfaces that comprise a plurality of line segments that form oblique and/or orthogonal angles therebetween may be used to mount more than one LED die in the plastic cup. For example, in some embodiments, the LED die is a first LED die disposed in the plastic cup such that the outer face of the anode contact is closely spaced apart from the metal anode pad adjacent a first one of the line segments and the outer face of the cathode contact is closely spaced apart from the metal cathode pad adjacent the first one of the line segments. The LED component further comprises a second LED die that also comprises first and second opposing faces and an anode contact and a cathode contact on the first face thereof, the anode and cathode contacts including outer faces remote from the second LED die. The second LED die is also disposed in the plastic cup such that the outer face of the anode contact is closely spaced apart from the metal anode pad adjacent a second one of the line segments and the outer face of the cathode contact is closely spaced apart from the metal cathode pad adjacent the second one of the line segments.

In yet other configurations of the metal pads, one of the metal anode pad or the metal cathode pad includes three edges and the other of the metal cathode pad or the metal anode pad extends adjacent the three edges. In other embodiments, one of the metal anode pad or the metal cathode pad includes four edges and the other of the metal cathode pad or the metal anode pad extends adjacent the four edges.

Various embodiments described above configure the metal anode pad, the metal cathode pad and/or the plastic cup to facilitate the direct attachment of the LED die to the lead frame. In other embodiments, the die attach layer itself is configured to facilitate the direct electrical connection of the outer face of the anode contact to the exposed portion of the metal anode pad and the direct electrical connection of the outer face of the cathode contact to the exposed portion of the metal cathode pad by the die attach layer. Specifically, in some embodiments, the exposed portions of the metal anode and cathode pads deviate from coplanarity by a height difference, and the die attach layer is thicker than the height difference. In other embodiments, the die attach layer also may be thicker than 3 μm. In still other embodiments, the die attach layer is of different thickness between the outer face of the anode contact that is closely spaced apart from the exposed portion of the metal anode pad compared to between the outer face of the cathode contact that is closely spaced apart from the exposed portion of the metal cathode pad.

Yet other embodiments may configure the composition of the die attach layer to facilitate the direct electrical connection. Specifically, in some embodiments, the die attach layer comprises Gold (Au), Nickel (Ni) and Tin (Sn). In other embodiments, 0<Au wt %≤10, 10≤Ni wt %≤60 and 40≤Sn wt %≤90. In yet other embodiments, 0.8≤Au wt %≤4.5, 19≤Ni wt %≤41 and 55≤Sn wt %≤80.

In still other embodiments, the plastic cup comprises silicone and the die attach material has a melting temperature below a decomposition temperature of the silicone. In yet other embodiments, the die attach material has a melting temperature below 260° C. Moreover, in other embodiments, the die attach material has a melting temperature and has a re-melting temperature that is higher than the melting temperature. In some embodiments, the melting temperature is below 260° C. and the re-melting temperature is above 260° C.

It will be understood that the various embodiments of configuring the metal anode pad, the metal cathode pad, the plastic cup and/or the die attach layer that are described herein may be used together in various combinations or subcombinations, depending upon many factors, including factors related to the LED die, factors related to the lead frame, factors related to the overall LED component and/or the application for which the LED component is intended. In one example, the deviation from coplanarity that is provided by an LED package may dictate which of the above-described configurations of the metal anode pad, the metal cathode pad, the plastic cup and/or the die attach layer are used.

Various embodiments described above have described LED components. However, other embodiments described herein may provide a lead frame itself or an LED itself.

Specifically, a lead frame according to various embodiments described herein, may include a metal anode pad and a metal cathode pad, and a plastic cup on the metal anode pad and the metal cathode pad that defines an exposed portion of the metal anode pad and an exposed portion of the metal cathode pad in the plastic cup. The metal anode pad, the metal cathode pad and/or the plastic cup are configured to facilitate a direct solder connection of respective anode and cathode contacts of a Light Emitting Diode (LED) die to the respective exposed portion of the metal anode pad and the exposed portion of the metal cathode pad. The metal anode pad, the metal cathode pad and/or the plastic cup may be configured according to any and all of the embodiments described herein.

Similarly, an LED according to various embodiments described herein may include an LED die that comprises first and second opposing faces and an anode contact and a cathode contact on the first face thereof, the anode and cathode contacts including outer faces remote from the LED die, and a die attach layer on the outer faces of the anode contact and the cathode contact. The die attach layer is configured to facilitate direct attachment of the die attach layer to metal anode and cathode pads of a lead frame. The die attach layer may be configured to facilitate direct attachment according to any and all of the embodiments described herein.

Methods of fabricating an LED component may also be provided according to various embodiments described herein. These methods may comprise providing a lead frame that comprises a metal anode pad, a metal cathode pad and a plastic cup on the metal anode pad and the metal cathode pad that defines an exposed portion of the metal anode pad and an exposed portion of the metal cathode pad in the plastic cup, and providing an LED die that comprises first and second opposing faces, an anode contact and a cathode contact on the first face thereof, and a die attach layer on outer faces of the anode and cathode contacts remote from the LED die. The LED die is placed in the cup such that the die attach layer is directly on the exposed portion of the metal anode pad and the exposed portion of the metal cathode pad. The die attach layer is then melted so that the die attach layer directly electrically connects the outer face of the anode contact to the exposed portion of the metal anode pad and directly electrically connects the outer face of the cathode contact to the exposed portion of the metal cathode pad. The lead frame and/or die attach layer may be configured according to any and all of the embodiments described herein.

BRIEF DESCRIPTION OF THE DRAWINGS

FIG. 18 is a cross-sectional view of an LED component including an LED die that is directly attached to a lead frame according to yet other embodiments described herein.

FIG. 19 is a cross-sectional view of an LED die according to various embodiments described herein.

FIG. 20 is a cross-sectional view of a conventional LED die.

DETAILED DESCRIPTION

Figure 1:
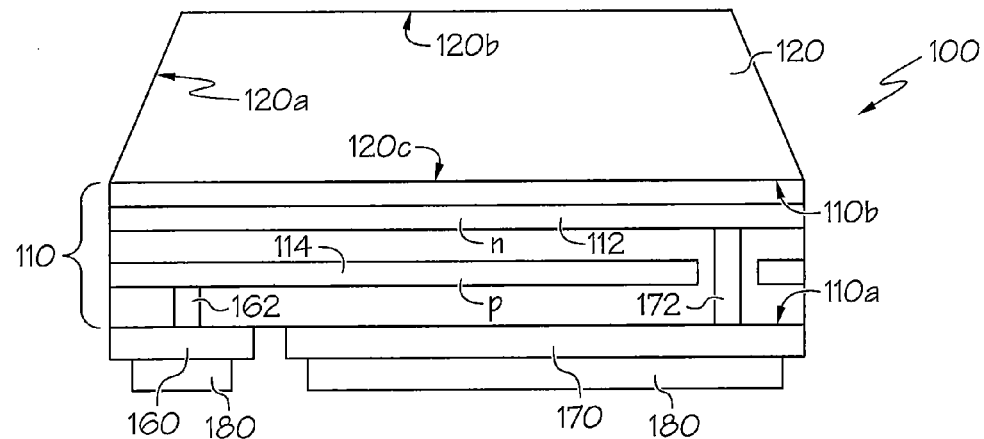
FIG. 1 is a cross-sectional view of an LED die according to various embodiments described herein.

Various embodiments of the inventive concepts now will be described more fully with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items and may be abbreviated as "/".

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes", "including", "have" and/or "having" (and variants thereof) when used herein, specify the presence of stated features, steps, operations, elements, and/or components, but do not preclude the presence or addition of one or more other features, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Various embodiments are described herein with reference to cross-sectional and/or other illustrations that are schematic illustrations of idealized embodiments. As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the inventive concepts, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Introduction

Various embodiments described herein can provide an LED component that comprises an SMD lead frame and an LED that is electrically connected to the SMD lead frame without wire bonds. More specifically, one or both of the LED contacts is directly attached to the SMD lead frame using a die attach layer, such as solder.

Various embodiments described herein may arise from recognition that SMD LEDs using lead frame technology have the potential advantage of very low cost. Yet, heretofore, at least one of the LED die contacts, and in many cases both of the LED die contacts, were connected to the SMD lead frame using one or more wire bonds. Wire bonds can compensate for the deviation from flatness and the high degree of mechanical flex in low cost SMD lead frames. This deviation from flatness and mechanical flex may only increase as lower cost plastics, such as silicone, are used for the lead frame cup.

Yet, various embodiments described herein have recognized that the configuration of the metal anode pad, the metal cathode pad and/or the plastic cup of the SMD LED lead frame, and/or the configuration of the die attach material, can be changed, so as to allow the elimination of wire bonding in the SMD LED component and allow direct attachment of both the anode and cathode contacts of the LED die to the respective metal anode pad and cathode pad of the lead frame using a die attach layer, such as solder. The direct die attachment can be lower cost and more robust than wire bonding and can also allow more compact SMD components.

Many techniques will be described below for configuring the metal anode pad, the metal cathode pad, the plastic cup and/or the die attach layer, to facilitate direct attachment of an LED die to an SMD lead frame without wire bonds. However, having recognized the breakthrough that an LED die can be electrically connected to the SMD lead frame without wire bonds, many other configurations may be envisioned by those of skill in the art.

FIG. 1 is a cross-sectional view of a Light Emitting Diode (LED) die, also referred to as an LED chip, according to various embodiments described herein. Referring to FIG. 1, the LED die 100 includes a diode region 110 having first and second opposing faces 110a, 110b, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on the first face 110a. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110a. The cathode contact 170 may directly ohmically contact the n-type layer 112, or may ohmically contact the n-type layer 112 by way of one or more conductive vias 172 and/or other intermediate layers. As illustrated in FIG. 1, the anode contact 160 and that cathode contact 170 that both extend on the first face 110a are coplanar, although they need not be coplanar. The diode region 110 also may be referred to herein as an "LED epi region", because it is typically formed epitaxially on a substrate 120. For example, a Group III-nitride based LED epi region 110 may be formed on a silicon carbide growth substrate. In some embodiments, the growth substrate may be present in the finished product. In other embodiments, the growth substrate may be removed. In still other embodiments, another substrate may be provided that is different from the growth substrate.

As also shown in FIG. 1, a die attach layer 180 is also provided on the outer face of the anode contact 160 and on the outer face of the cathode contact 170. As will be described in detail below, the die attach layer 180 may be configured to facilitate direct attachment of the LED die to an SMD lead frame.

As also shown in FIG. 1, a transparent substrate 120, such as a transparent silicon carbide growth substrate, is included on the second face 110b of the diode region 110. The transparent substrate 120 includes a sidewall 120a and may also include an inner face 120c adjacent the second face 110b of the diode region 110 and an outer face 120b, remote from the inner face 120c. The outer face 120b may be of smaller area than the inner face 120c. In some embodiments, the sidewall 120a may be stepped, beveled and/or faceted, so as to provide the outer face 120b that is of smaller area than the inner face 120c. In other embodiments, as shown in FIG. 1, the sidewall is an oblique sidewall 120a that extends at an oblique angle, and in some embodiments at an obtuse angle, from the outer face 120b towards the inner face 120c. In yet other embodiments, the sidewall 120a may be orthogonal to the faces. Moreover, the LED die 100 may include a layer comprising luminophoric material, such as phosphor, on at least some of the outer surfaces thereof. The layer may extend on the outer face 120b, on the sidewall 120a and/or on the side of the diode region 110, and may be conformal and/or nonconformal to the surface on which it extends. Yet other optical and/or protective layers may be provided on the LED die.

LED dies 100 configured as was described above in connection with FIG. 1, may be referred to as "horizontal"

or "lateral" LEDs, because both the anode and the cathode contacts thereof are provided on a single face of the LED die. Horizontal LEDs may be contrasted with vertical LEDs in which the anode and cathode contacts are provided on opposite faces thereof.

Various other configurations of horizontal LEDs that may be used according to any of the embodiments described herein, are described in detail in U.S. Pat. No. 8,368,100 to Donofrio et al., entitled "Semiconductor Light Emitting Diodes Having Reflective Structures and Methods of Fabricating Same"; U.S. Patent Application Publication 2011/0031502 to Bergmann et al., entitled "Light Emitting Diodes Including Integrated Backside Reflector and Die Attach"; U.S. Patent Application Publication 2012/0193660 to Donofrio et al. entitled "Horizontal Light Emitting Diodes Including Phosphor Particles"; and U.S. Patent Application Publication 2012/0193662 to Donofrio et al. entitled "Reflective Mounting Substrates for Flip-Chip Mounted Horizontal LEDs", assigned to the assignee of the present application, the disclosures of which are hereby incorporated herein by reference in their entirety as if set forth fully herein.

Other configurations of horizontal LEDs may be embodied by the "Direct Attach" LED chips that are marketed by Cree, Inc., the assignee of the present application, and which are described, for example, in Data Sheets entitled "*Direct Attach DA2432™ LEDs*" (Data Sheet: CPR3FM Rev.-, 2011); "*Direct Attach DA1000™ LEDs*" (Data Sheet: CPR3ES Rev. A, 2010); and "*Direct Attach DA3547™ LEDs*" (Data Sheet: CPR3EL Rev. D, 2010-2012), the disclosures of which are hereby incorporated herein by reference in their entirety as if set forth fully herein.

In order to simplify the drawings which follow, the internal structure of LED dies 100 will not be illustrated. Rather, the following figures will illustrate the LED die 100 schematically, but will illustrate anode contact 160, cathode contact 170 and die attach layer 180. Since the die attach layer may be modified according to various embodiments described herein, it will be labeled 180'. The LED die 100 comprises first and second opposing faces, wherein the first opposing face is the first face 110*a* of the diode region and the second face is the second face 110*b* of the diode region when no substrate is present, or the outer face 120*b* of the substrate 120 when a substrate 120 is present. The anode contact 160 and the cathode contact 170 are on the first face 110*a*.

Moreover, in various embodiments described herein, all of the LED dies 100 may be illustrated as being of the same size and generally rectangular or square. However, the LED dies 100 may be of other shapes, and need not all be the same size or type of LED die. Moreover, the anode and cathode contacts 160 and 170, respectively, are all illustrated as being different in size. In other embodiments, however, the anode and/or cathode contacts of the various LED may be of the same size, shape and/or thickness, and/or the anode and/or cathode contacts of the various LEDs need not be the same size, shape and/or thickness as one another. The LED dies 100 may emit different colors of light and may include a luminophoric layer, such as phosphor layer thereon. For example, in some embodiments, a combination of white (for example, blue shifted yellow) and red LED dies may be provided. Moreover, any number of multiple LED dies 100 may be provided based on the requirements of the LED component.

Direct Attach SMD LED Components

Figure 2A:
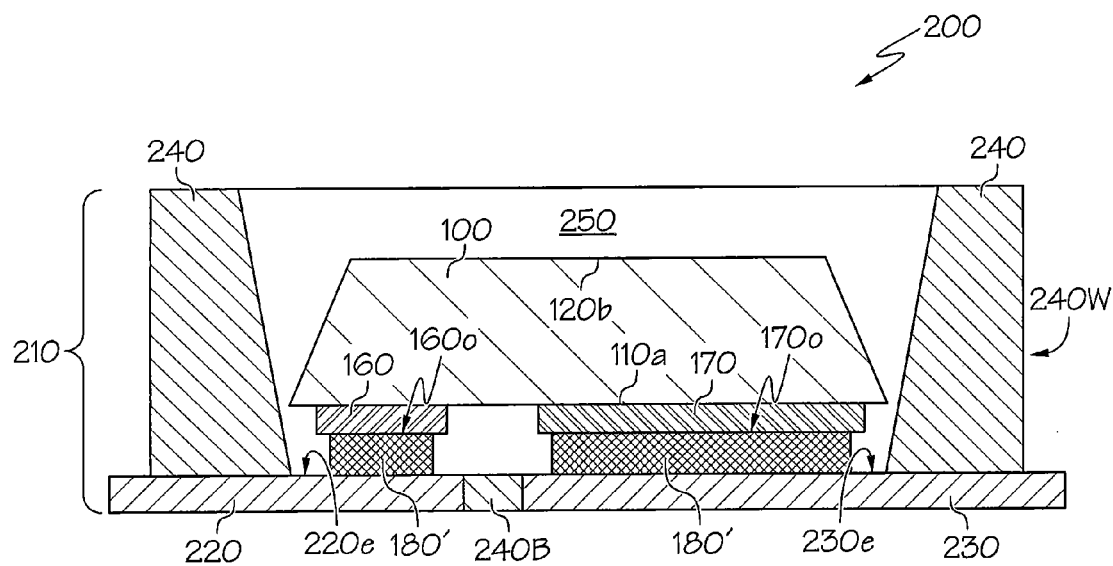
FIG. 2A is a cross-sectional view of an LED component including an LED die that is directly attached to a lead frame according to various embodiments described herein.
Figure 2B:
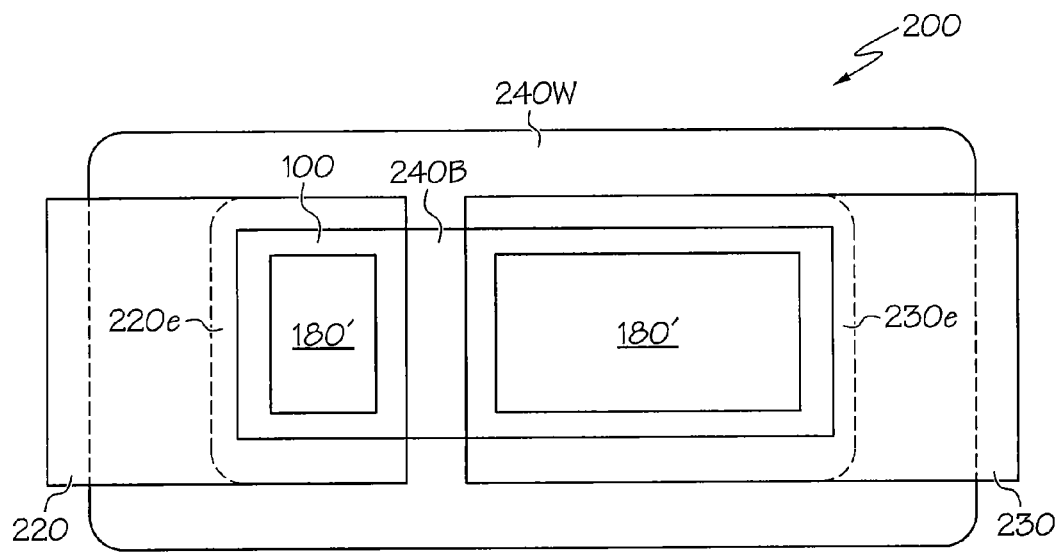
FIG. 2B is a top view of the LED component of FIG. 2A.

FIG. 2A is a cross-sectional view, and FIG. 2B is a top view, of an LED component according to various embodiments described herein. Referring to FIGS. 2A and 2B, the LED component 200 comprises a lead frame 210 that itself includes a metal anode pad 220, a metal cathode pad 230 and a plastic cup 240 on the metal anode pad 220 and the metal cathode pad 230 that defines an exposed portion 220*e* of the metal anode pad 220 and an exposed portion 230*e* of the metal cathode pad 230 in the plastic cup 240. The LED component 200 also includes an LED die 100 that comprises first and second opposing faces 110*a*, 120*b*, respectively, and an anode contact 160 and a cathode contact 170 on the first face 110*a* thereof. The anode and cathode contacts 160 and 170 include outer faces 160*o*, 170*o*, respectively, remote from the LED die 100. The LED die 100 is disposed in the plastic cup 240, such that the outer face 160*o* of the anode contact 160 is closely spaced apart from the exposed portion 220*e* of the metal anode pad 220 and the outer face 170*o* of the cathode contact 170 is closely spaced apart from the exposed portion 230*e* of the metal cathode pad 230.

The LED component 200 also includes a die attach layer 180' that extends between the outer face 160*o* of the anode contact 160 and the exposed portion 220*e* of the metal anode pad 220, and also extends between the outer face 170*o* of the cathode contact 170 and the exposed portion 230*e* of the metal cathode pad 230. Moreover, the die attach layer 180' directly electrically connects the outer face 160*o* of the anode contact 160 to the exposed portion 220*e* of the metal anode pad 220, and also directly electrically connects the outer face 170*o* of the cathode contact 170 to the exposed portion 230*e* of the metal cathode pad 230.

The metal anode pad 220 and the metal cathode pad 230 may be part of a larger metal lead frame structure that is singulated after component manufacture, as will be described in detail below. The metal lead frame structure may comprise a patterned flat plate of copper, copper alloy and/or other conductive metal. It will also be understood that although the metal anode pad 220 and the metal cathode pad 230 are shown as a single layer, multiple layer pads may also be provided. For example, a reflective coating may be provided on all or part of the exposed portions 220*e*, 230*e* and/or on other portions of the surface of the metal anode pad 220 and metal cathode pad 230 that face the LED die 100, to enhance reflectivity of any light that is emitted by the LED that directly or indirectly impinges on the surface of the metal anode pad 220 and/or the metal cathode pad 230. Moreover, although the metal anode pad 220 and the metal cathode pad 230 are illustrated as extending beyond the plastic cup 240, they need not do so. Finally, it will be understood that the metal anode pad 220 and the metal cathode pad 230 may be of the same size, shape and/or thickness, or may be different size, shape and/or thickness.

The plastic cup 240 may comprise a plastic. As used herein, a "plastic" is any of a wide range of synthetic or semi-synthetic organic solids that are moldable. Plastics are typically organic polymers of high molecular mass, but they often contain other substances. In some embodiments, the plastic cup 240 may comprise polyphthalamide (PPA), which is a thermoplastic synthetic resin of the polyamide (nylon) family, and which has a relatively high melting point of between 290° C. and 305° C. In other embodiments, the plastic cup 240 may comprise polycyclohexylenedimethylene terephthalate (PCT), which is a thermoplastic polyester that also may have a melting point of between 290° C. and 305° C. In other embodiments, the plastic cup 240 may comprise an Epoxy Molding Compound (EMC), which are flexible epoxy resins which may have a melting point of between 270° C. and 280° C. Moreover, present-day and future plastic cups 240 may comprise silicones of varied compositions and which may have a decomposition temperature of 350° C. Silicones are polymers that include silicon together with carbon, hydrogen, oxygen and/or other elements. As understood by those having skill in the art, some silicones may not actually melt. Rather, they may be decomposed, for example by charring, off-gassing, etc. This decomposition may begin at 350° C., but this decomposition temperature may vary depending upon the silicone that is used. Other silicones may decompose and melt at the same temperature. Yet other silicones may have a melting temperature that is higher than the decomposition temperature. Yet other plastic materials may be used.

Moreover, at least some portion of the plastic cup 240 may be transparent, translucent and/or opaque. The plastic cup 240 also need not be uniform in construction, so that it may include various portions that are transparent, translucent or opaque, and other portions that are not transparent, translucent or opaque. Additional materials may also be added in the plastic cup, for example to enhance the reflectance thereof, to provide optical scattering and/or to provide wavelength conversion. It will also be understood that the plastic cup 240 may be molded on the metal anode and cathode pads 220 and 230, respectively, after LED die attach, rather than before LED die attach as described herein.

The plastic cup 240 may comprise a plastic cup wall 240W that is on the metal anode pad 220 and the metal cathode pad 230, and extends away from the metal anode pad 220 and the metal cathode pad 230, to define a cavity or recess therein in which the LED die 100 is disposed. The plastic cup wall 240W may be of uniform thickness, or variable thickness as illustrated in FIG. 2A, and may include various protrusions, bulges or recesses therein. A cup base 240B may generally extend in the direction of the metal anode pad 220 and metal cathode pad 230, and may also extend on either face of the metal anode pad 220 and/or metal cathode pad 230. The outer edge of the cup base 240B may be wider and/or narrower than the outer edge of the cup wall 240W, or may be congruent thereto. Moreover, the outer edge of the cup base 240B may have a different shape than the outer edge of the cup wall 240W.

The die attach layer 180' may comprise a lead-based or lead-free solder. Moreover, according to various embodiments described herein, a ternary solder that comprises gold (Au), nickel (Ni) and tin (Sn) may also be used. Quaternary (or other) variations of this solder may also be provided, as will be described in detail below. The die attach layer 180' may be fabricated using deposition and/or other conventional techniques.

Finally, FIG. 2A also illustrates an encapsulant 250 in, and in some embodiments filling, the interior of the plastic cup 240. In some embodiments, the encapsulant 250 may also include silicone, which may be the same composition and/or a different composition than that of the plastic cup 240. The encapsulant 250 may be uniform or non-uniform in composition, and may include optical materials therein, such as index matching, scattering, reflecting and/or wavelength conversion materials such as phosphor, that may be uniformly or non-uniformly distributed therein. The outer surface of the encapsulant 250 may be flush with the outer surface of the plastic cup 240, as illustrated in FIG. 2A. However, in other embodiments, the outer surface of the encapsulant may be dished or domed relative to the outer surface of the cup 240. Moreover, various optical features such as macro lenses and/or microlenses may be provided in and/or on the outer surface of the encapsulant 250.

FIGS. 2A and 2B may also be regarded as illustrating an LED component according to various embodiments described herein that comprises an SMD lead frame 210 and an LED die 100 that is electrically connected to the SMD lead frame 210 without wire bonds. In some embodiments, the SMD lead frame 210 comprises a plastic cup 240 and the LED die 100 is in the plastic cup 240 and is electrically connected to the SMD lead frame 210 in the plastic cup 240. In some embodiments, the LED die 100 is soldered to the SMD lead frame 210, for example using the die attach layer 180'.

FIGS. 2A and 2B also illustrate a surface mount device lead frame according to various embodiments described herein. The surface mount device lead frame 210 comprises a metal anode pad 220 and a metal cathode pad 230. A plastic cup 240 is provided on the metal anode pad 220 and the metal cathode pad 230 that defines an exposed portion 220e of the metal anode pad 220 and an exposed portion 230e of the metal cathode pad 230. The metal anode pad 220, the metal cathode pad 230 and/or the plastic cup 240 are configured to facilitate direct solder attachment of anode and cathode contacts 160 and 170, respectively, of an LED die 100 to the respective exposed portions 220e, 230e of the metal anode pad 220 and the metal cathode pad 230. In some embodiments, the plastic cup 240 is not included in the lead frame 210.

FIGS. 2A and 2B also illustrate a surface mount device LED that comprises an LED die 100 having first and second opposing faces 110a, 120b, respectively, and an anode contact 160 and a cathode contact 170 on the first face 110a thereof. The anode and cathode contacts 160 and 170 include outer faces 160o, 170o, respectively, remote from the LED die 100. A die attach layer 180' is provided on the outer faces 160o, 170o of the anode contact 160 and the cathode contact 170. The die attach layer 180' is configured to facilitate direct attachment of the die attach layer 180' to anode and cathode pads 220, 230, respectively, of an SMD lead frame 210.

Figure 3:
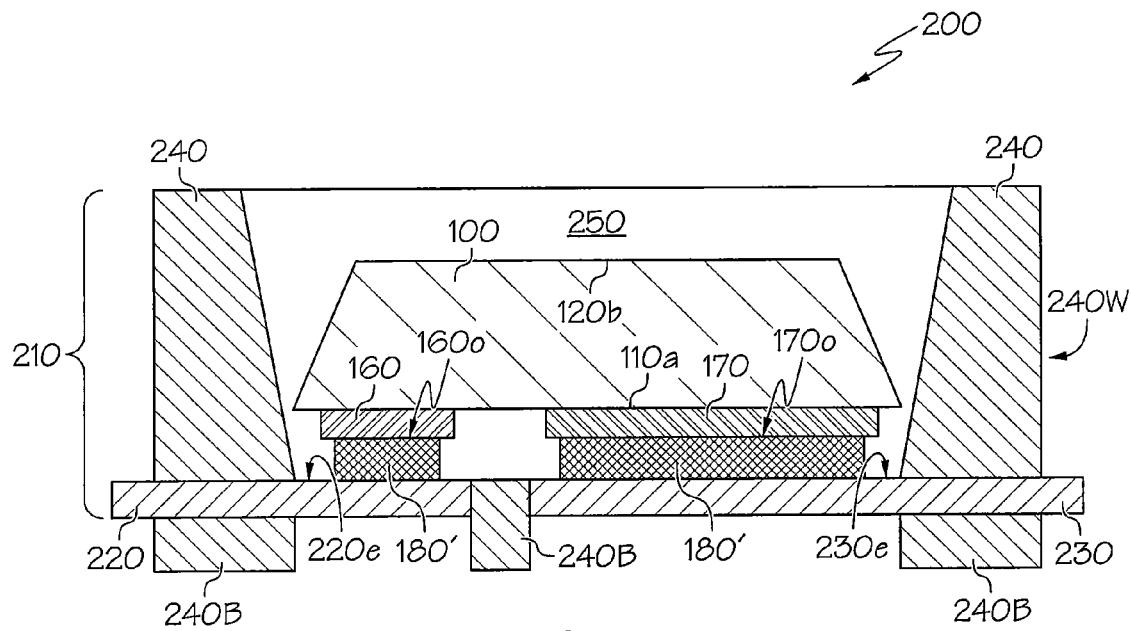
FIG. 3 is a cross-sectional view of an LED component including an LED die that is directly attached to a lead frame according to various other embodiments described herein.
Figure 4:
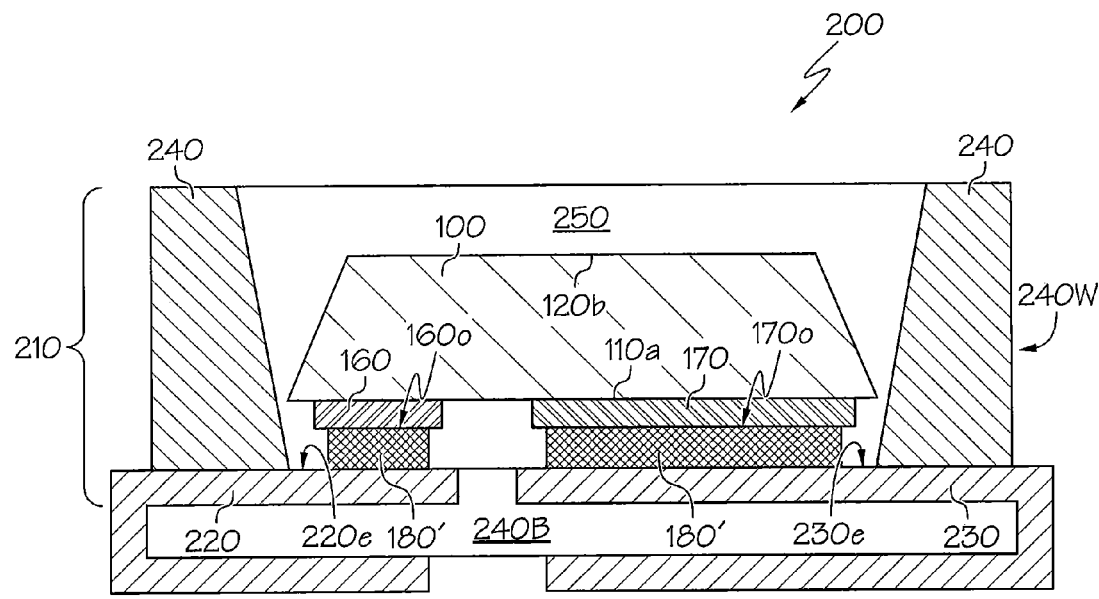
FIG. 4 is a cross-sectional view of an LED component including an LED die that is directly attached to a lead frame according to yet other embodiments described herein.

In FIG. 2A, the plastic cup 240 is only on the exposed surface 220e, 230e of the metal anode pad 220 and metal cathode pad 230. However, as illustrated in FIG. 3, the plastic cup base 240B may also extend on the surfaces of the metal anode pad 220 and the metal cathode pad 230 opposite the exposed surfaces 220e, 230e. Moreover, as shown in FIG. 4, the plastic cup base 240B may extend in a continuous manner on the surfaces of the metal anode pad 220 and metal cathode pad 230 that are opposite the exposed surfaces 220e, 230e thereof. Moreover, in some embodiments, the metal anode pad 220 and the metal cathode pad 230 may be bent around the plastic cup base 240B to provide external contacts for the LED component 200. Many other variations of lead frames 210 may be provided according to various embodiments described herein. For example, some embodiments of a lead frame 210 may not include a plastic cup 240.

According to various embodiments that will now be described in detail, the metal anode pad 220, the metal cathode pad 230, the plastic cup 240 and/or the die attach material 180' may be configured to facilitate the direct electrical connection of the outer face 160o of the anode contact 160 to the exposed portion 220e of the metal anode pad 220, and the direct electrical connection of the outer face 170o of the cathode contact 170 to the exposed portion 230e of the metal cathode pad 230, by the die attach layer 180'. Various structural and compositional configurations will now be described. It will be understood that these configurations may be varied in combination or in various subcombinations to achieve a desired LED component yield from the standpoint of performance and/or reliability. The individual aspects of the configuration of the metal anode pad 220, metal cathode pad 230, plastic cup 240 and/or die attach layer 180' that are selected will depend on the particular LED die 100 and/or lead frame 210 that is being used, and/or the particular cost, reliability and/or performance that is desired. However, by configuring the metal anode pad 220, the metal cathode pad 230, the plastic cup 240 and/or the die attach material 180' according to various embodiments described herein and/or other configurations that may be developed by those having skill in the art, direct attachment of an LED die 100 to a surface mount lead frame 210 without wire bonds may be achieved.

In general, lead frames may provide low cost alternatives to ceramic submounts that are conventionally used in LED components. Moreover, lead frames have good thermal conductivity, since the package floor can be almost all metal. Stated differently, the LED die are bonded to the metal, which is in turn soldered to a board, so as to provide low thermal resistance. Lead frames can run on SMD package lines that tend to be cheaper and more depreciated with less expensive tools. As but one example, lead frames may not require a mechanical saw to singulate individual components, but, rather, may use a cheaper punch technology that has lower capital investment and lower consumption cost compared to conventional ceramic packages.

Unfortunately, however, lead frames may have poor reliability when they are made out of PPA, PCT, or EMC, as compared to ceramic. SMD lead frames also may be less flat than ceramic, which makes attaching LED dies a challenge. Lead frames also are generally not temperature-stable up to the reflow temperature of conventional gold-tin eutectic solders, so that upon reflow the packages may tend to darken. Recent advancements in silicone-based lead frames may provide better reliability and can withstand a higher reflow temperature. However, silicone-based lead frames tend to be flimsy and flexible. As such, while the metal anode and cathode pads may be generally coplanar, they are not perfectly coplanar, and generally are not flat enough to allow direct die attach of both the anode and cathode contacts of an LED die.

Various embodiments that will now be described can allow the metal anode pad 220, metal cathode pad 230, plastic cup 240 and/or die attach material 180' to be configured, so as to allow a lead frame 210, and particularly a silicone-based lead frame 210, to work with a direct attach LED die 100, to provide a path for high volume, low cost and reliable LED components.

In the following sections, various configurations of the metal anode pad 220, metal cathode pad 230 and plastic cup 240 will first be described. Then, various configurations of the die attach layer 180' will be described.

Configuring the Metal Anode Pad, the Metal Cathode Pad and/or the Plastic Cup

Various embodiments will now be described that can configure the metal anode pad 220, the metal cathode pad 230 and/or the plastic cup 240 of the lead frame 210, to facilitate the direct electrical connection of the outer face 160o of the anode contact 160 to the exposed portion 220e of the metal anode pad 220, and the direct electrical connection of the outer face 170o of the cathode contact 170 to the exposed portion 230e of the metal cathode pad 230, by the die attach layer 180'. In general, the metal anode pad 220, metal cathode pad 230 and/or plastic cup 240 may be configured according to various embodiments described herein by (a) increasing an extension of the cup base relative to a gap between the metal anode and cathode pads; (b) providing temporary links between the metal anode and cathode pads; and/or (c) providing curved facing surfaces between the metal anode and cathode pads. Each of these configurations may be designed to reduce the deviation from planarity of the anode and cathode pads. Each of these configurations will now be described in detail.

(a) Increasing an Extension of the Cup Base Relative to a Gap Between the Metal Anode and Cathode Pads According to various embodiments that will now be described, adjacent ends of the metal anode pad and the metal cathode pad define a gap therebetween. The plastic cup extends in the gap and also extends beyond non-adjacent ends of the metal anode pad and the metal cathode pad by a distance. The distance is larger than the gap. The plastic cup may be configured to extend in the gap and beyond the non-adjacent ends during the molding process that forms the plastic cup.

Figure 5:
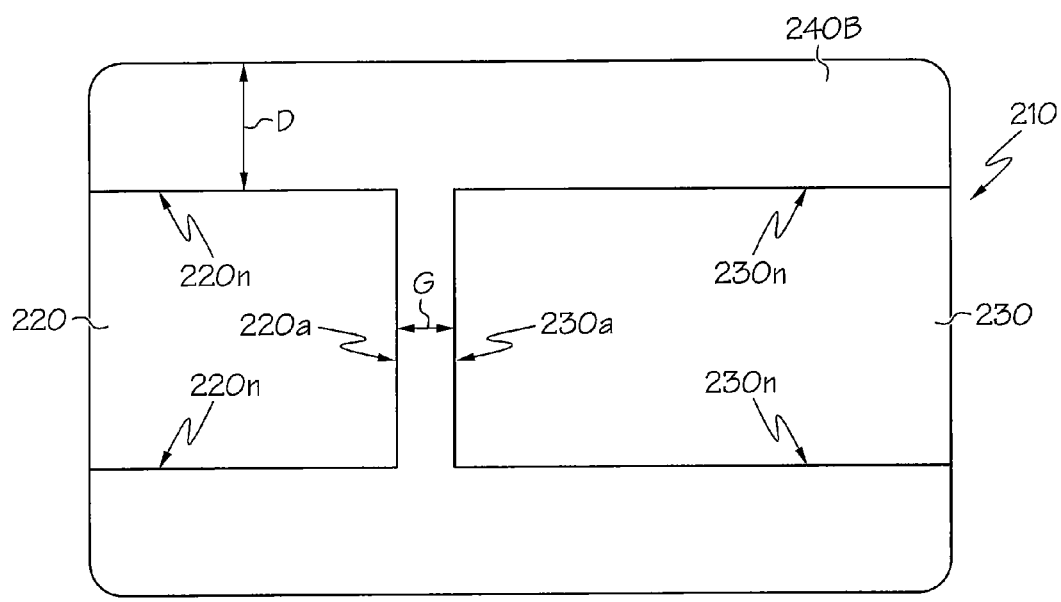
FIGS. 5-11 are bottom views of a lead frame according to various embodiments described herein.

More specifically, FIG. 5 is a simplified bottom view of a lead frame 210 of FIGS. 2A and 2B. As illustrated in FIG. 5, adjacent ends 220a, 230a of the metal anode pad 220 and the metal cathode pad 230, respectively, define a gap G therebetween. Moreover, the base 240B of the plastic cup 240 extends in the gap G. The base 240B of the plastic cup 240 also extends beyond non-adjacent ends 220n, 230n of the anode and cathode pads 220, 230, respectively, by a distance D. According to various embodiments described herein, the distance D is larger than the gap G.

Conventionally, the distance D is minimized in order to decrease the overall size of the LED component and allow more components per lead frame and per resin load, to thereby allow lower cost to be achieved. However, according to various embodiments described herein, the distance D is configured to be larger than the gap G. In other embodiments, a thicker cup wall 240W also may be provided, that is thicker than the gap G.

Without wishing to be bound by any theory of operation, it has been found that the rigidity of the lead frame 210 shown in FIG. 5 can be increased and/or a deviation from planarity of the adjacent ends 220a, 230a of the anode and cathode pads 220, 230 may be reduced, by providing a larger distance D and/or a thicker cup wall 240W. As described above, in some embodiments, the distance D is larger than the gap G. In other embodiments, the distance D is at least 10% larger than the gap G. In yet other embodiments, the distance D is at least 30% larger than the gap G. Thus, embodiments of FIG. 5 increase the ratio between the extension distance D and the gap G. This increase in ratio can provide a more rigid framework, which can allow for a higher rate of successful die attach on the lead frame material due to an increase in overall structural rigidity. This may be the case even when flexible silicone is used for the cup 240.

It will also be understood that various embodiments of FIG. 5 may lead to a slight decrease in thermal performance of the LED component because the metal anode and cathode pads 220, 230 occupy a smaller percentage of the overall width of the component. This slight decrease in thermal performance may not present an undue disadvantage, because the thermal performance of lead frames, and especially of LED dies that are die attached to the lead frame rather than wire bonded to the lead frame, may be more than adequate to ensure good thermal performance.

Figure 6:
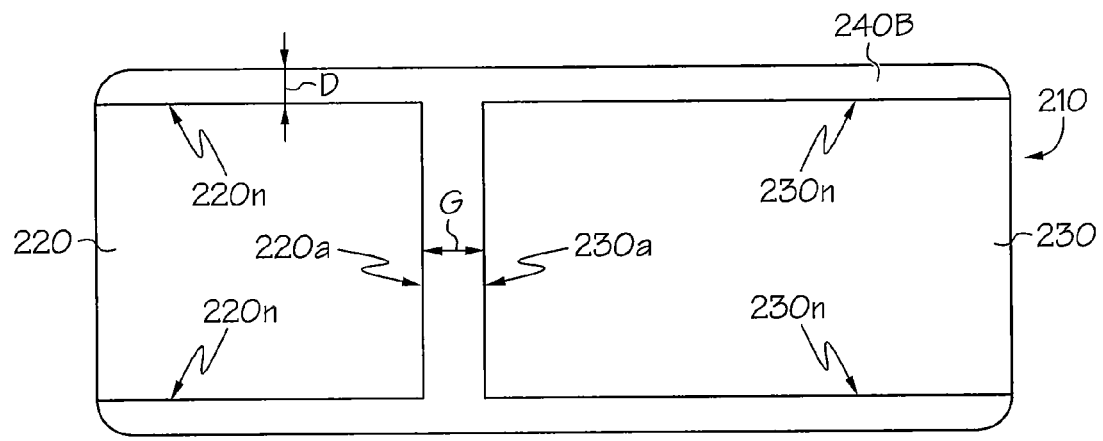

In a particular example, the gap G may have a width of between 100 μm to 200 μm, and the distance D may be greater than 220 μm in some embodiments, greater than 300 μm in other embodiments, and greater than 400 μm in yet other embodiments. In some embodiments, the distance D does not exceed 1,000 µm. In other embodiments, when thermal performance is of greater concern than mechanical rigidity, the distance D may be made less than the gap G, as illustrated in FIG. 6.

It will also be understood that the distance D need not be greater than or less than the gap G throughout the LED component 200. Rather, this relationship may only be present over some of the non-adjacent ends 220$n$, 230$n$, or may only be present over portions of the non-adjacent ends 220$n$, 230$n$. Stated differently, the gap G may be of nonuniform width over the extent thereof, and the distance D need not be uniform over the extent thereof. Moreover, the distance D need not be the same adjacent each of the non-adjacent ends 220$n$ of the metal anode pad 220 and/or adjacent each of the non-adjacent ends 230$n$ of the metal cathode pad 230.

Figure 7:
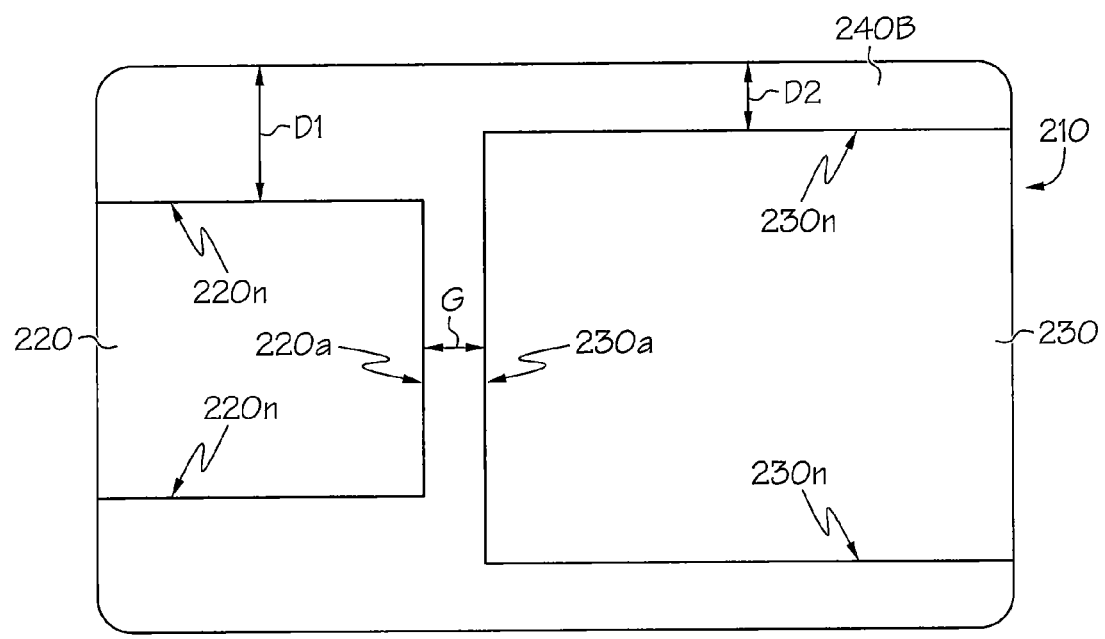

FIG. 7 illustrates other embodiments wherein different ratios of the distance D to the gap G may be provided in a single component, in order to allow potential benefits of better thermal properties as well as higher package rigidity or stability. For example, in FIG. 7, two different ratios of the distance D1 for the metal anode pad 220 relative to the gap G and the distance D2 of the metal cathode pad 230 relative to the gap G may be provided.

Various embodiments described in connection with FIG. 7 may arise from recognition that one of the metal pads, such as the metal cathode pad 230, may be larger than the other of the metal pads, such as the metal anode pad 220, which can provide better thermal performance for this larger metal cathode pad 230. In contrast, the other metal pad, such as the metal anode pad 220, may be less important for thermal performance, so that its width may be decreased so as to provide a larger distance D1 for stability. It will be understood that, in the above description, the roles of the metal anode pad 220 and the metal cathode pad 230 may be reversed.

Thus, FIG. 7 illustrates various embodiments described herein, wherein the adjacent ends 220$a$ and 230$a$, respectively, of the metal anode pad 220 and the metal cathode pad 230 have different widths. It will also be understood that, in some embodiments, multiple LED dies are provided within a single plastic cup. In these embodiments, different gaps and different distances may be provided for at least some of the multiple LED dies in the plastic cup.

The different widths of the adjacent ends 220$a$ and 230$a$, respectively, of the metal anode pad 220 and the metal cathode pad 230 may also be achieved by selectively covering portions of the metal anode pad 220 and/or the metal cathode pad 230 with the plastic material from the cup base 240B. Thus, in some embodiments, the cup base 240B may form a ridge on one or both of the opposing faces of the metal anode pad 220 and/or the metal cathode pad 230. This ridge may also at least partially clamp the metal anode pad 220 and/or the metal cathode pad 230, and thereby reduce deviation from planarity. For example, as was illustrated in FIG. 3 and/or FIG. 4, the plastic cup base 240B may extend on the opposite faces of the metal anode pad 220 and/or the metal cathode pad 230. This may provide a ridge on the pad(s) and may further clamp the pad(s) to increase coplanarity. Moreover, by allowing the base 240B of the plastic cup 240 to extend on the outer surface of the metal anode pad 220 and/or the metal cathode pad 230, the lead frame package designer can custom design the backside appearance and functionality of the LED component.

Various embodiments of FIGS. 5-7 can increase the stability and other beneficial physical properties, such as thermal conductivity, of lead frame-style packages that are used with direct-attach LED dies by modifying the width ratio between the cup base and/or wall thickness and the gap between the metal pads on the back of the lead frame. An increase in the ratio between the thickness and the gap can lead to a more rigid lead frame, allowing for a higher rate of successful die attach on the lead frame material due to an increase in overall structural rigidity. A lower ratio between the thickness and the gap can lead to a more flexible package with better thermal parameters due to the increased thermal mass on the bottom of the package. Conventionally, packages have narrow cup walls with dominant metal pads on the back of the lead frame package.

(b) Providing Temporary Links Between the Metal Anode and Cathode Pads

According to various other embodiments described herein, the planarity of the metal anode pad and metal cathode pad may be increased, so as to facilitate die attach without wire bonding, by providing temporary links that mechanically connect the metal anode pad to the metal cathode pad outside the plastic cup. These temporary links can increase the structural rigidity of the metal anode and the metal cathode pad during die attach. The temporary links can be severed during and/or after singulation of the individual components, after die attach.

Figure 8:
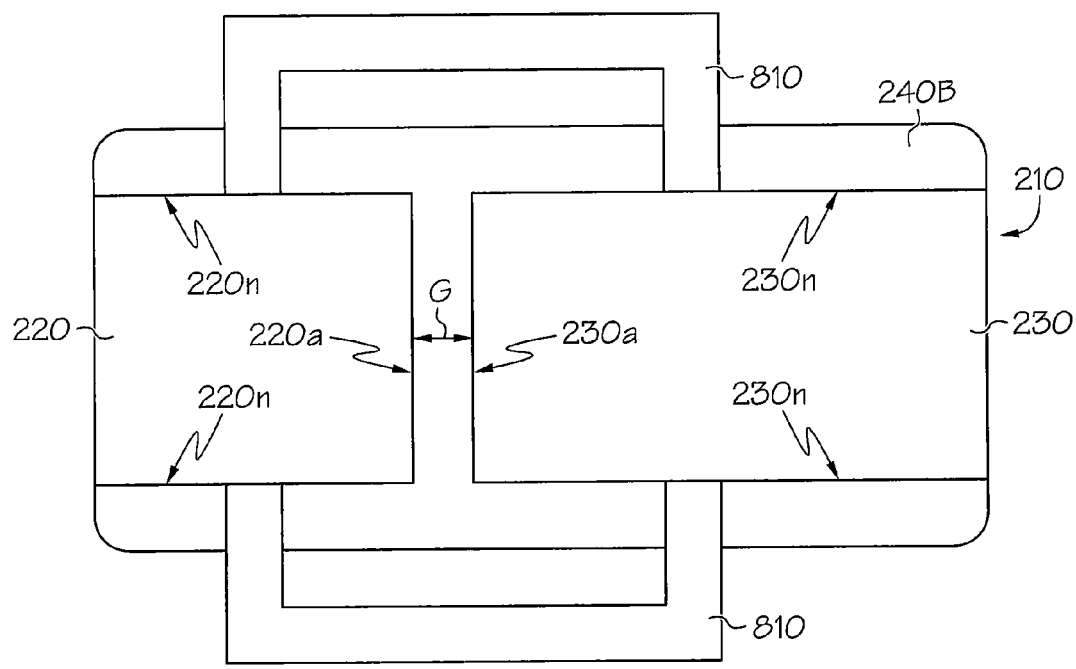

More specifically, referring to FIG. 8, a lead frame 210 may include one or more metal links 810 that mechanically connect the metal anode pad 220 to the metal cathode pad 230 outside the plastic cup base 240B. The metal links 810 may be provided as part of the initial lead frame structure that is used to fabricate a large number of LED components. The metal links 810 are only temporary because they would short circuit the LED if they remained in the finished product. Thus, during singulation, which separates the individual LED components from the initial lead frame structure, the metal links 810 may be severed along with any other temporary links that link the individual anode and cathode metal pads 220, 230 to the initial lead frame structure. Alternatively, they may be severed prior to or after singulation. It will be understood that fewer or more links 810 may be provided and various configurations of links may be provided. For example, although U-shaped links 810 are illustrated in FIG. 8, other shapes may be provided.

Figure 9:
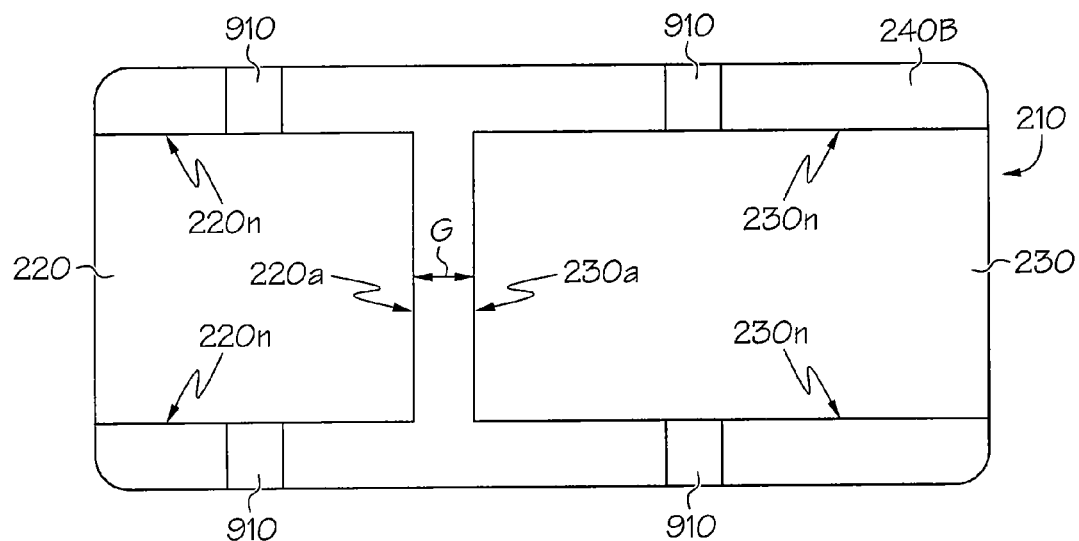

FIG. 9 illustrates the LED component of FIG. 8 after singulation. Note the LED has not been illustrated for clarity. The portions of the links 810 outside the plastic cup 240 have been removed, but tabs 910 remain. These tabs 910 may provide an indication that a link 810 was used during fabrication of the LED component to provide higher stability, according to various embodiments described herein.

Accordingly, FIGS. 8 and 9 illustrate various embodiments described herein wherein out-of-cup connecting links or legs may be used to increase the package stability and rigidity of lead frame-style packages for direct attach LED die components. Conventionally, the metal anode and cathode contact pads may essentially float, with their edges encapsulated in the cup material. In sharp contrast, embodiments of FIG. 8 provide metal connecting links or legs outside the package edge. These links can help to lock the pads to the same height, i.e., to increase planarity, and add package rigidity. As shown in FIG. 9, at package singulation, the connecting links or legs can be sheared to produce a finished package. The shearing may also sever indirect connections of the metal anode and cathode pads to the remainder of the lead frame.

Figure 10:
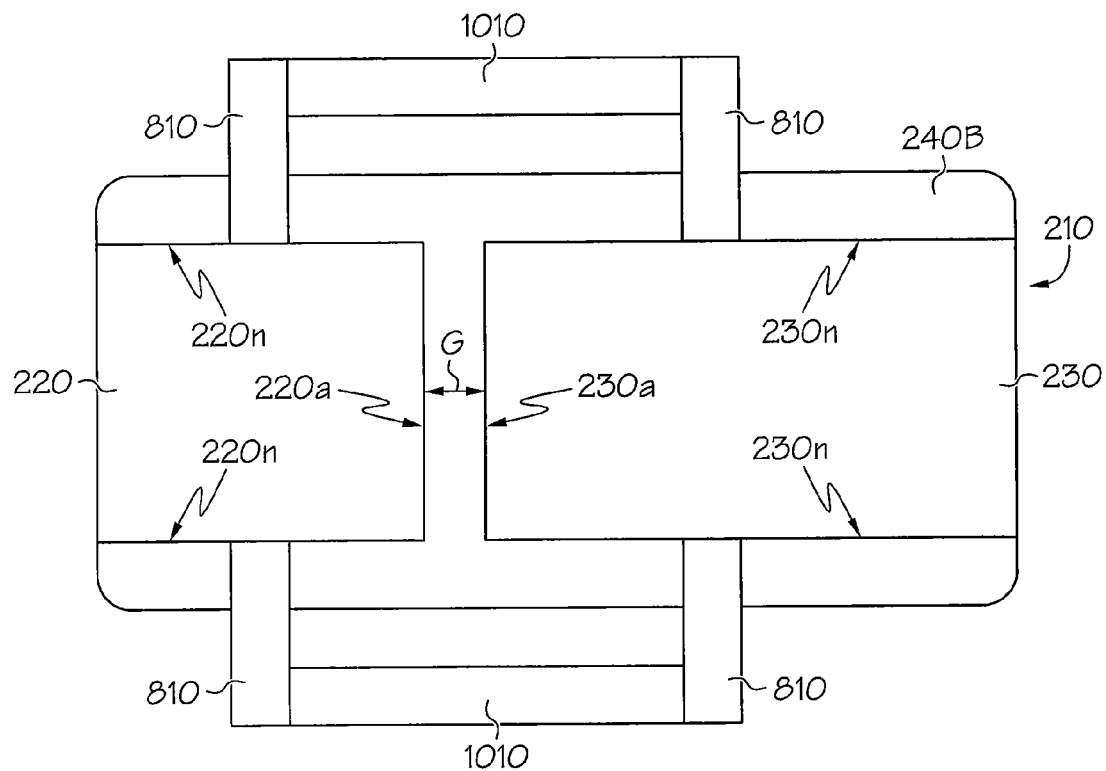

FIG. 10 illustrates other embodiments wherein the metal link 810 includes a fusible metal portion 1010. For example, any metal alloy or pure metal with a melting point below a decomposition temperature of the plastic cup may be used.

This can allow for fast shear by locally heating the connecting links 810 above the melting point of the fusible portion 1010. Laser heating and/or other local heating techniques may be used. Global heating may also be used if the appropriate fusible material is selected. It will also be understood that the fusible material may extend to all of the link 810, to all of the link 810 that is outside the plastic cup 240 and/or may only correspond to a small portion of the metal link 810 outside the plastic cup 240 that is sufficient to open the link. In other embodiments, the fusible link 1010 may be inside the cup, as long as it is accessible to melting by a laser and/or other technique. Thus, the cup material may be molded around a fusible metal link in the interior of the cup, so that the link can be melted using a laser and/or other technique.

It will also be understood that the configuration and position of the metal link(s) may be varied according to various embodiments described herein. For example, the arms of the link 810 may be closer to one another and may be closer to the gap between the metal anode pad 220 and the metal cathode pad 230 than is illustrated in FIGS. 8-10, so as to increase the structural rigidity of the adjacent ends 220a, 230a of the metal anode and cathode contacts 220, 230, respectively. Moreover, the link(s) 810 can be sheared at the package edge (leaving no extra metal exposed outside the lead frame package, as was illustrated in FIG. 9) and/or outside the package (leaving metal exposed outside the package for contact points, thermal sinks and/or other purposes as illustrated, for example, in FIG. 10).

(c) Providing Curved Facing Surfaces Between the Metal Anode and Cathode Pads

Various embodiments that were described above in connection with FIGS. 5-10 illustrated a gap G between the adjacent ends 220a, 230a, respectively, of the metal anode pad and the metal cathode pad 220, 230, respectively, that extended in a straight line along the adjacent ends 220a, 230a. Stated differently, straight facing surfaces 220a, 230a of the metal anode and cathode pads 220, 230, respectively, were illustrated. According to various embodiments that now will be described, curved facing surfaces may be provided. The curved facing surfaces may include smoothly curved and/or segmented portions. The curved facing surfaces can provide a greater length of cup material along the gap and can thereby provide more structural rigidity than straight facing surfaces that minimize the length of the cup material in the gap. In some embodiments, the curved facing surfaces comprise a plurality of line segments that form oblique and/or orthogonal angles therebetween. The vertices of the angles may be sharp and/or rounded. In other embodiments, the curved facing surfaces may only include smoothly curved portions without any sharp angles.

Figure 11:
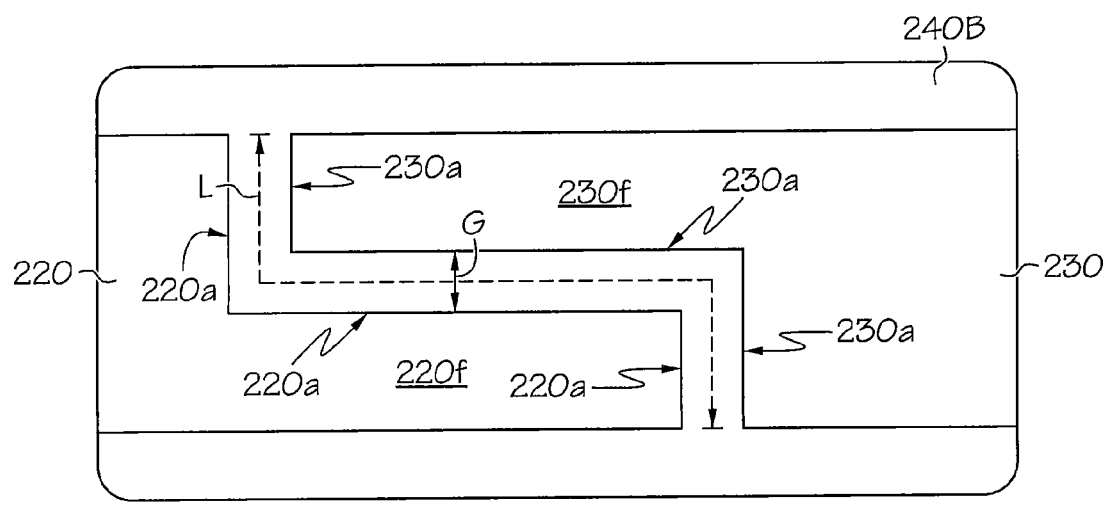

Specifically, referring to FIG. 11, a metal anode contact pad 220 and a metal cathode contact pad 230 are shown. As shown in FIG. 11, the contact pads 220 and 230 are in the form of interlocking fingers, which can increase the stability and die attach area for lead frame packages utilizing direct attach LED dies. Specifically, the metal anode pad 220 includes a metal finger 220f that extends toward the metal cathode pad 230, and the metal cathode pad 230 includes a metal finger 230f that extends towards the metal anode pad 220.

Thus, as shown in FIG. 11, the gap G is not linear, but is curved and includes three separate orthogonal line segments. Thus, the total length L of the gap G is longer than that of a straight line gap. The longer length L between the adjacent of the adjacent ends 220a and 230a of the metal anode pad 220 and the metal cathode pad 230, respectively, and the larger amount of plastic cup material in the elongated gap, can increase the stability of the lead frame package, so that the metal anode contact 220 and the metal cathode contact 230 are more planar. Stated differently, curved facing surfaces 220a, 230a of the metal anode and cathode pads 220, 230 can increase the stability of the lead frame and/or the planarity of the anode and cathode pads 220, 230, respectively.

Figure 12:
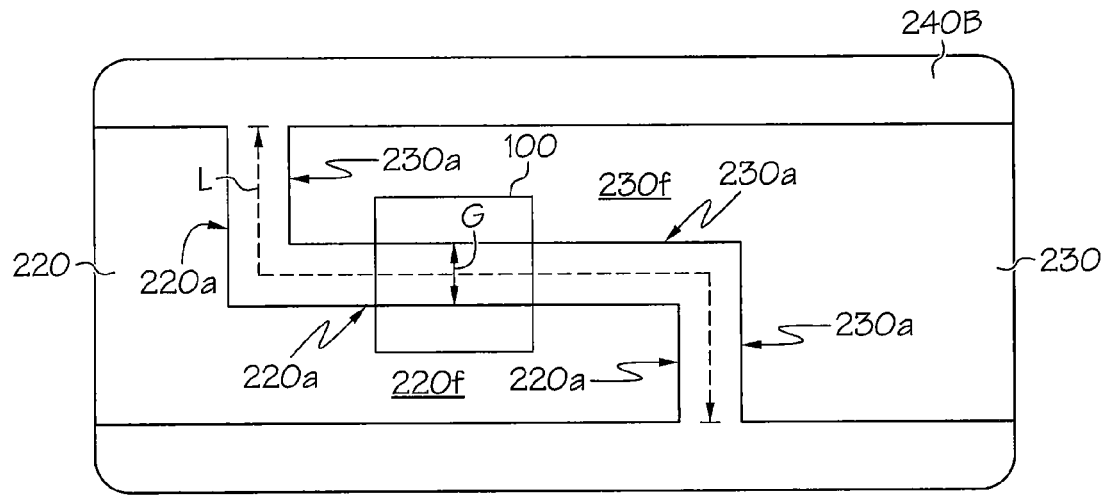
FIG. 12 and FIGS. 13A-13B, which may be collectively referred to herein as FIG. 13, are top views of an LED lead frame with one or more LED dies thereon according to various embodiments described herein.

FIG. 12 illustrates an LED component that is fabricated from the lead frame of FIG. 11, wherein a single LED die 100 is mounted on the lead frame having the curved facing surfaces. As shown, the LED die 100 is disposed in the cup 240 such that the outer face of the anode contact (not illustrated for clarity) is closely spaced apart from the metal anode pad 220 adjacent a first one of the line segments (the middle or horizontal facing surface 220a) and the outer face of the cathode contact (not illustrated for clarity) is closely spaced apart from the metal cathode pad 230 adjacent the first one of the line segments 230a (the middle or horizontal facing surface 230a). The anode and cathode contacts of the LED die may be sized and shaped appropriately to attach to the curved mating surfaces. In some embodiments, the anode and cathode contacts of the LED die may also have curved facing surfaces therebetween that correspond to the curved facing surfaces in the lead frame, so that a single LED die can span multiple line segments. FIG. 12 may also be regarded as illustrating an LED component wherein one of the metal anode pad or the metal cathode pad includes three edges, and the other of the metal cathode pad or the metal anode pad extends adjacent the three edges.

Figure 13A:
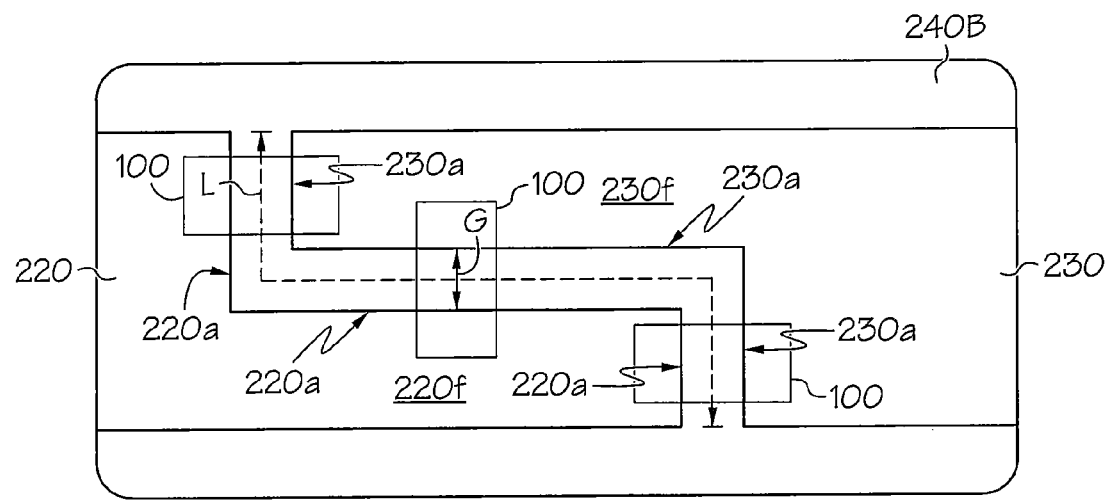

FIG. 13A illustrates multi-die embodiments of FIG. 12, wherein multiple LED dies 100 are used, a respective one of which spans a respective line segment in the curved facing surfaces. In embodiments of FIG. 13A, as in FIG. 12, the curved facing surfaces can provide increased stability to the package. Moreover, the per-segment arrangement of LED dies may allow spacing of the LED dies 100 farther apart from one another than may be the case for multiple LED dies spanning straight facing surfaces. The configurations may be symmetric, as illustrated in FIG. 13A, or may be asymmetric, wherein different dies and/or die spacings are used and/or asymmetric curves or line segments are used.

Figure 13B:
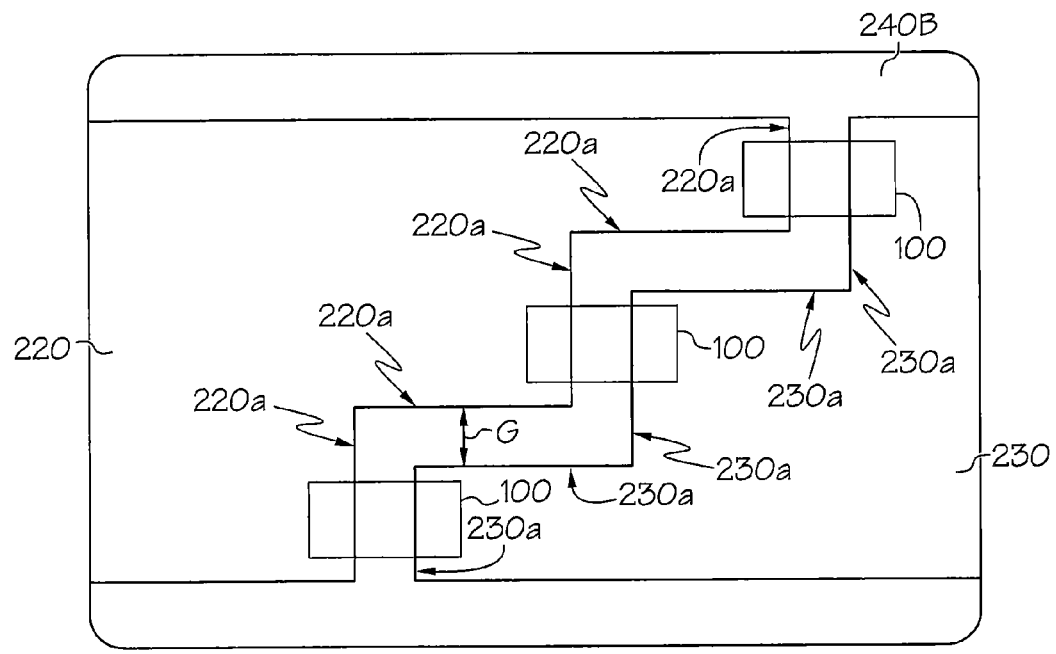

FIG. 13B illustrates other embodiments wherein the metal anode pad 220 and the metal cathode pad 230 both include five facing line segments 220a, 230a. Again, a respective LED die spans a respective line segment in the curved facing surfaces.

Figure 14:
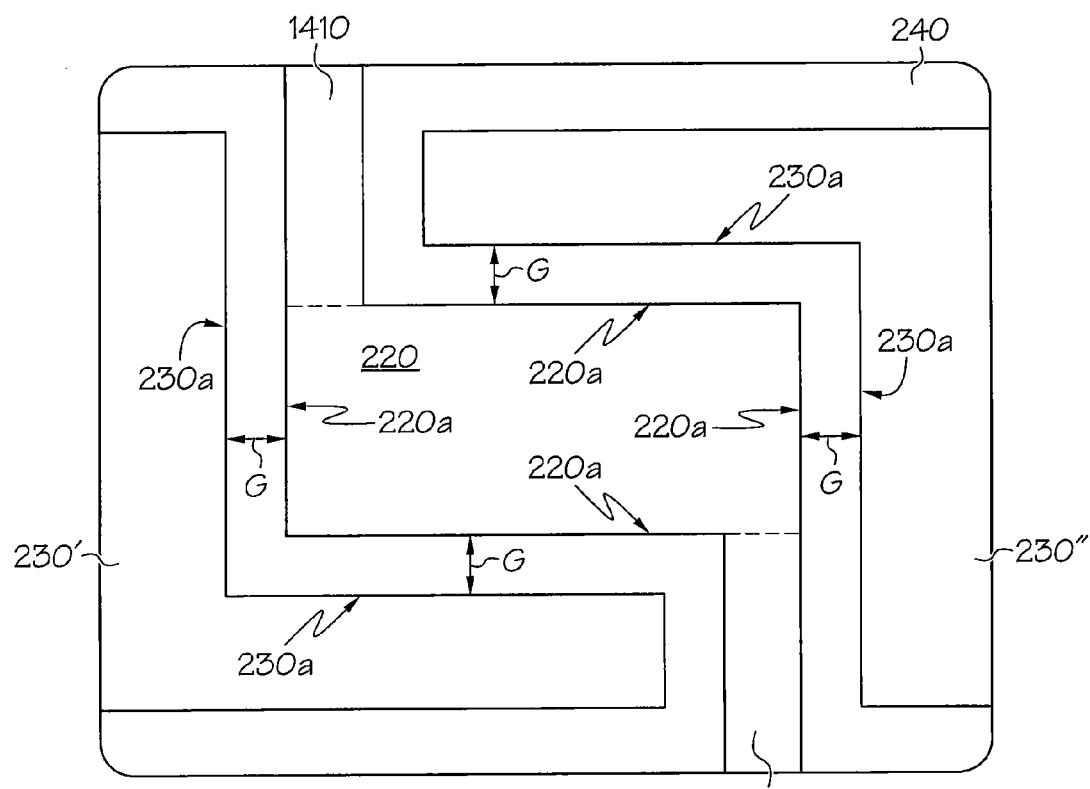
FIG. 14 is a bottom view of a lead frame according to various other embodiments described herein.

In all of the embodiments illustrated above, a single metal anode pad 220 and a single metal cathode pad 230 are provided in each LED component. In other embodiments, multiple metal anode pads and/or multiple metal cathode pads may be provided. For example, FIG. 14 illustrates additional embodiments of interlocking lead frame pads. In these embodiments, a single metal anode pad 220 and two metal cathode pads 230' and 230" are provided. The tabs 1410 on the metal anode pad 220 are provided so that the metal anode pad 220 may be attached to other elements of the lead frame during fabrication. In other embodiments, however, the tabs 1410 are not needed, and the metal anode pad 220 may be completely surrounded by the gap G, to provide a floating island metal anode pad. The central metal anode pad 220 is stabilized by the large amount of overlap among the facing surfaces 220a, 230a, which provide an extended length of the cup material in the gap G.

Figure 15:
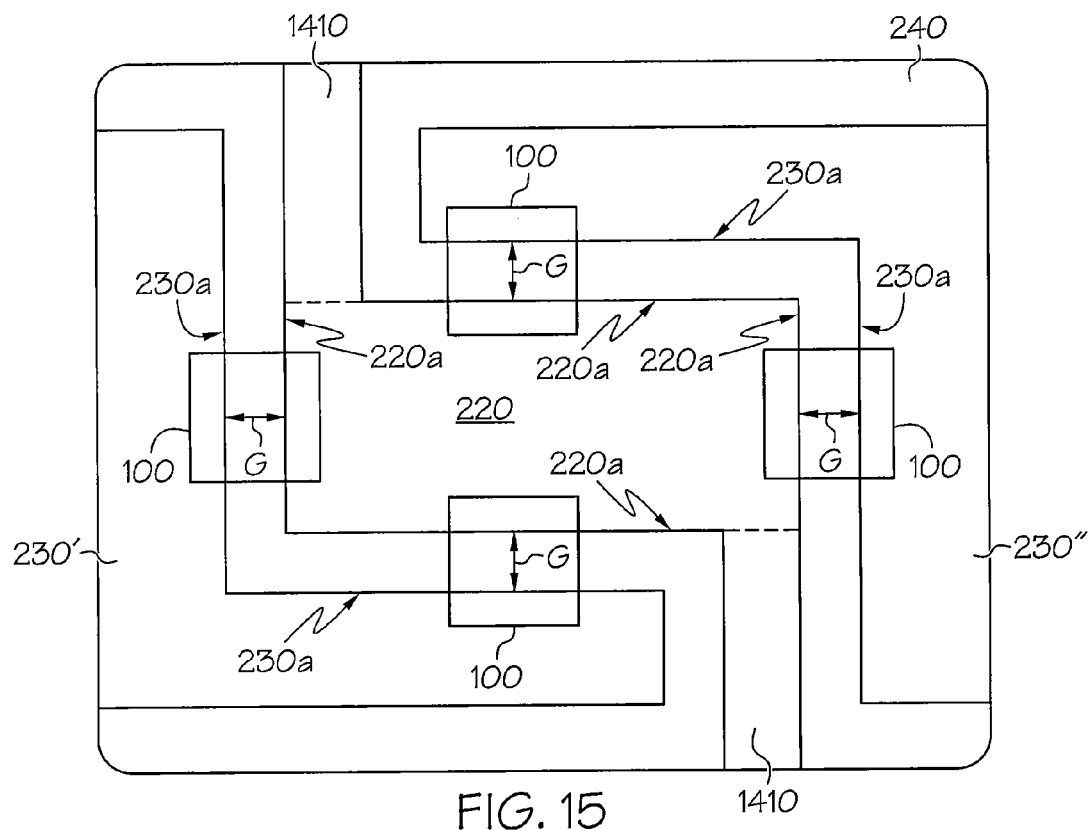
FIG. 15 is a top view of an LED lead frame with one or more LED dies thereon according to various other embodiments described herein.

FIG. 15 illustrates the lead frame of FIG. 14 with four LED dies 100 thereon. This component can provide two parallel strings of two LED dies each. Various other configurations also may be provided. They can be symmetric or asymmetric with respect to the dies and/or pads. It will be understood that various configurations of LED wiring may be provided by embodiments of FIGS. 14 and 15, depending upon the placement of the anode and cathode contacts of the LED dies 100 on the lead frame of FIGS. 14 and 15. For example, in some embodiments of FIG. 15, the anode contact of the four LED dies 100 may be die attached to the metal anode pad 220, the cathodes of two of these LED dies may be die attached to the first metal cathode pad 230' and the cathode contacts of the remaining two LED dies may be die attached to the second metal cathode pad 230". In other embodiments, the anode contacts of two of the LED dies and the cathode contacts of the remaining two LED dies are die attached to the pad 220, the anode contacts of the first two LED dies are die attached to the pad 230' and the cathode contacts of the remaining two LED dies are die attached to the pad 230" of FIG. 15, to provide two anti-parallel strings of two LED dies each. In these embodiments, the three metal pads 220, 230' and 230" may not provide an anode or a cathode for the component, but still may provide external connections for the component. Accordingly, depending upon the wiring of the LEDs, the terms "anode" and "cathode" may not apply to the pads 220, 230' and 230".

Figure 16:
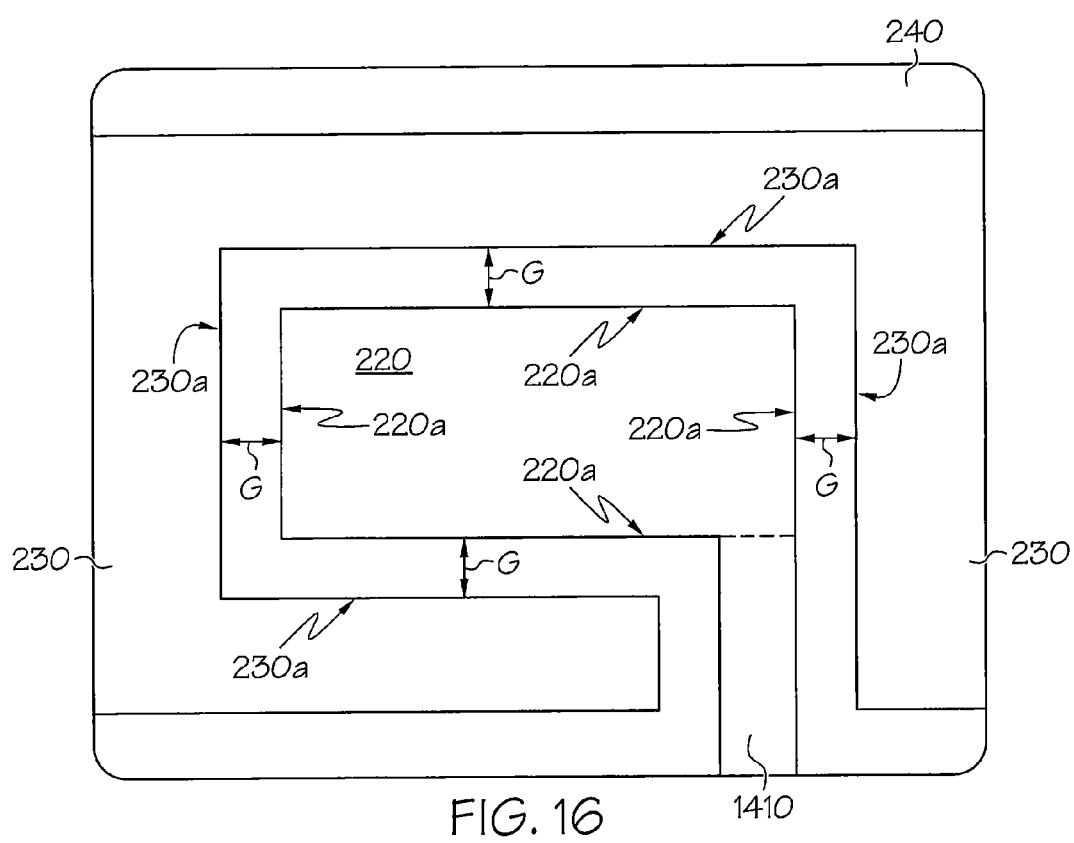
FIG. 16 is a bottom view of a lead frame according to still other embodiments described herein.
Figure 17A:
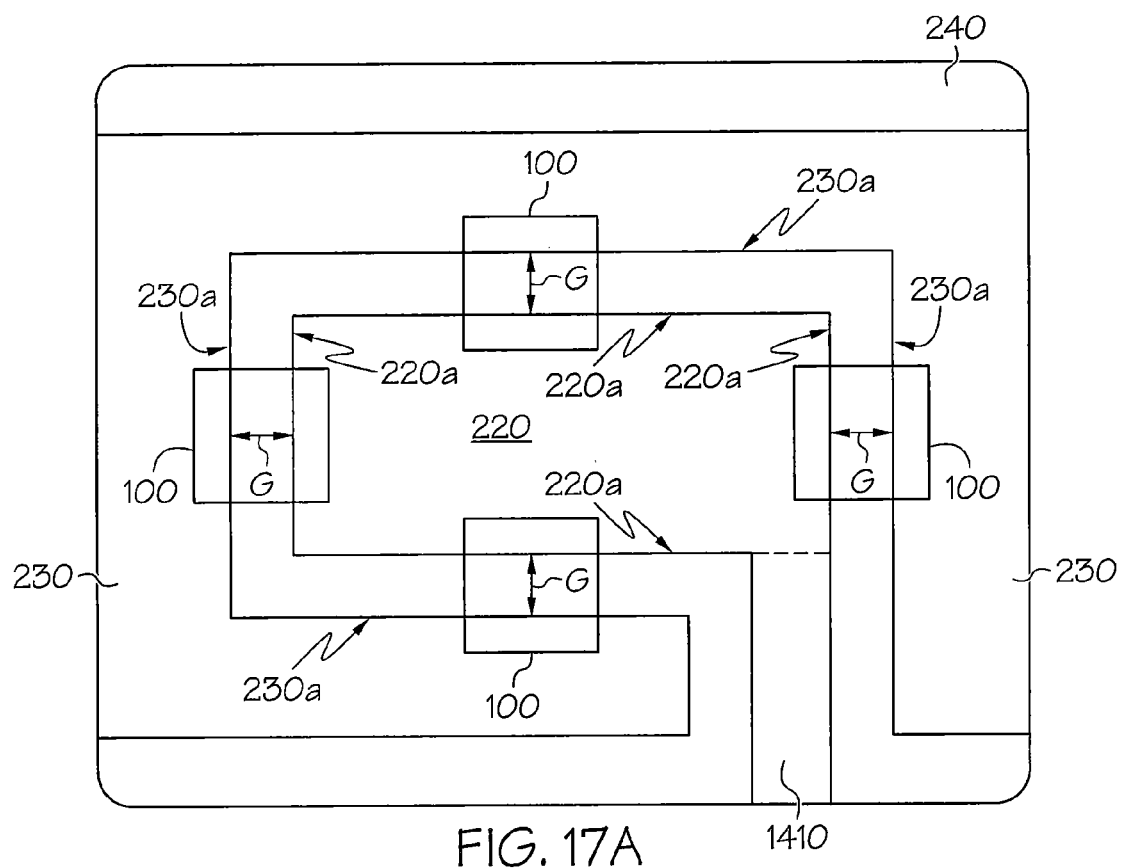
FIGS. 17A-17C, which may be collectively referred to herein as FIG. 17, are top views of an LED lead frame with one or more LED dies thereon according to still other embodiments described herein.
Figure 17B:
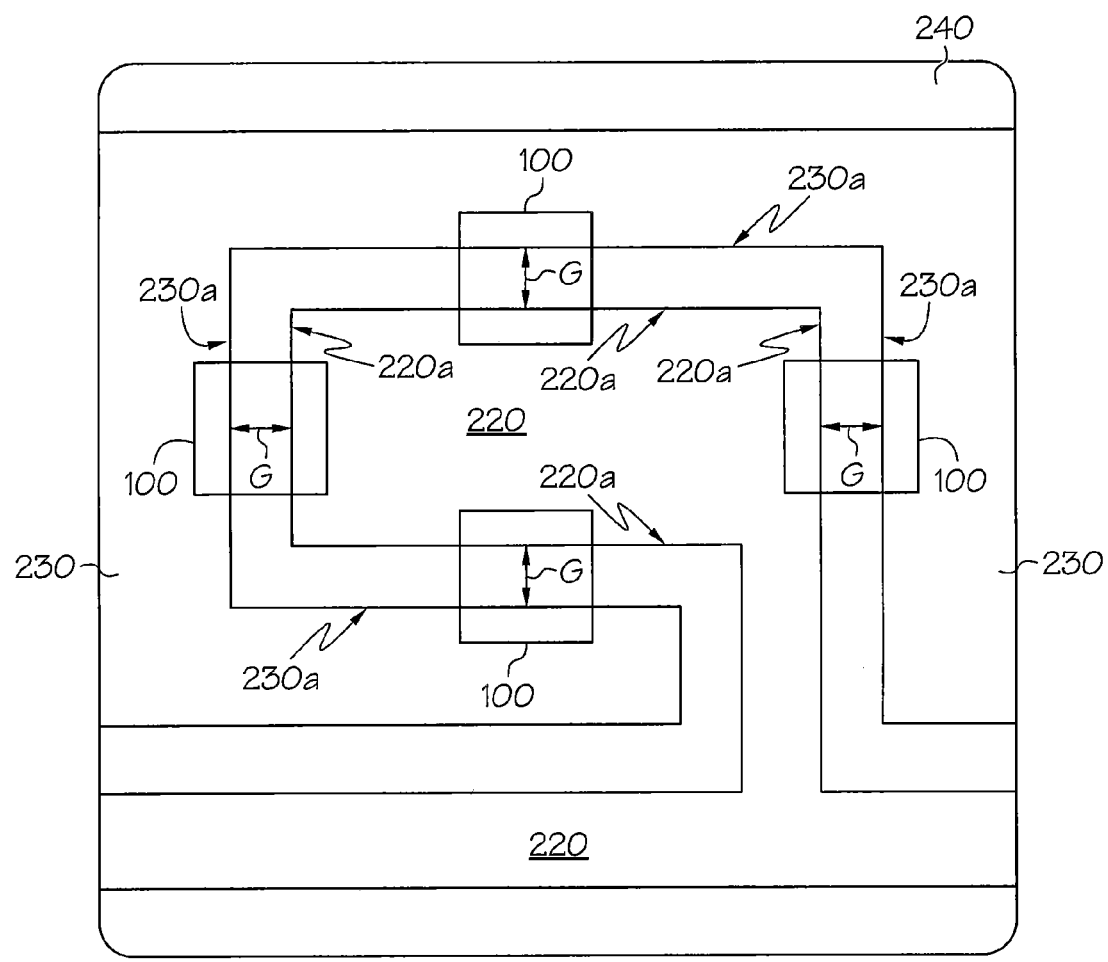

FIG. 16 illustrates another lead frame arrangement wherein only a single tab 1410 is provided to support the metal anode pad 220, and a single metal cathode pad 230 almost completely surrounds the metal anode pad on four sides thereof. FIG. 17A illustrates an LED component using the lead frame of FIG. 16 including four LED dies 100 thereon that are electrically connected in parallel. Accordingly, FIG. 17A illustrates various embodiments wherein one of the metal anode pad or the metal cathode pad includes four edges, and the other of the metal cathode pad or the metal anode pad extends adjacent the four edges. It will be understood that more than four edges also may be included in other embodiments. Thus, the metal anode pad and/or metal cathode pad may be pentagonal, hexagonal, octagonal, etc. It will also be understood that more or fewer LED dies may be included in an LED component and may be connected in series and/or in parallel. The LED dies 100 need not be the same as one another nor need they be placed symmetrically. For example, one or more of the LED dies 100 may be a blue shifted yellow LED die, whereas one or more of the LED dies may be a red LED die. FIG. 17B illustrates another configuration. Instead of a tab 1410, the anode contact pad 220 is extended compared to FIG. 17A.

Figure 17C:
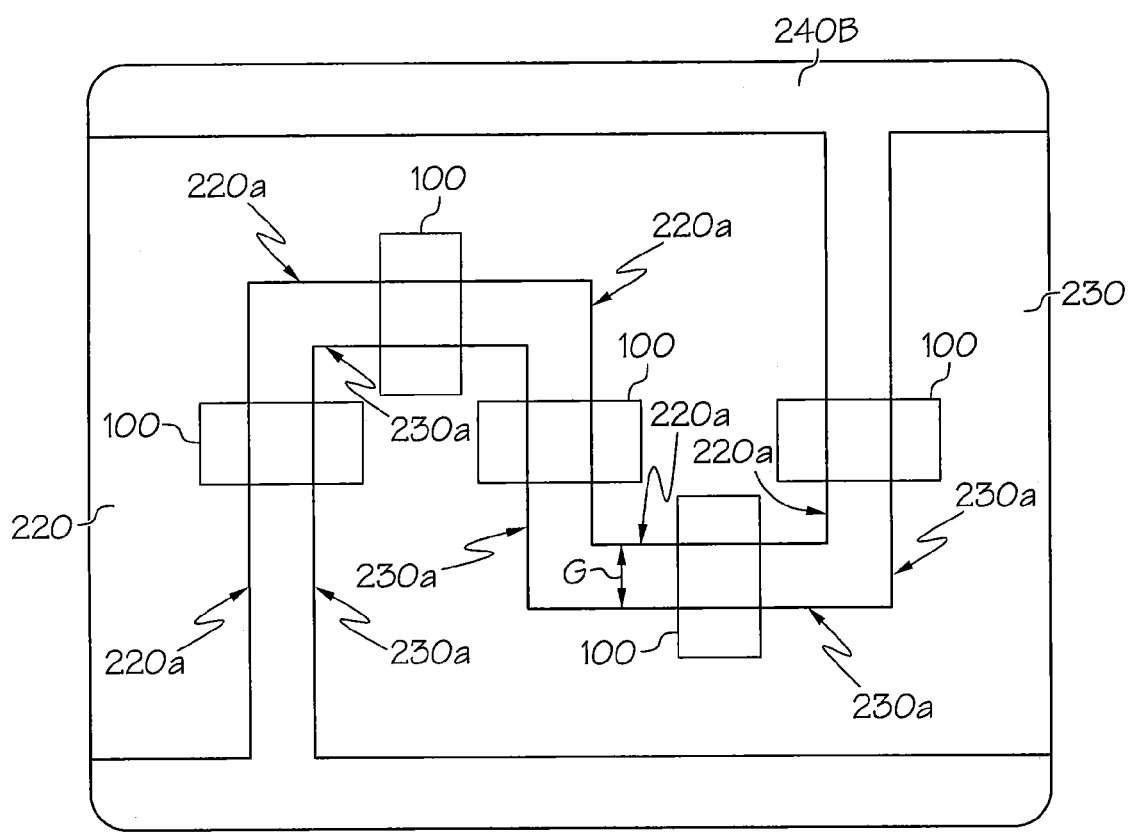

FIG. 17C illustrates other embodiments wherein the metal anode pad 220 and the metal cathode pad 230 each includes five facing line segments 220a, 230a, and wherein five LEDs 100 are used, a respective one of which is on a respective pair of facing line segments.

In conclusion, FIGS. 5-17 illustrated various embodiments where the metal anode pad 220, the metal cathode pad 230 and/or the plastic cup 240 are configured to facilitate the direct electrical connection of the outer face 160o of the anode contact 160 to the exposed portion 220e of the metal anode pad 220, and the direct electrical connection of the outer face 170o of the cathode contact 170 to the exposed portion 230e of the metal cathode pad 230, by the die attach layer 180'. Although various embodiments described above have been presented independently by (a) increasing the extension of the cup base relative to the gap; (b) providing temporary links; and (c) providing curved facing surfaces; these embodiments may also be provided in various combinations or subcombinations. For example, the increased distance (a) may be combined with temporary links (b) and/or may be combined with curved facing surfaces (c). Alternatively, the temporary links (b) may be combined with the increased extension (a) and/or the curved surfaces (c). Moreover, the curved surfaces (c) may be combined with the increased extension (a) and/or the temporary links (b). Finally, the increased extension (a), the temporary links (b) and the curved facing surfaces (c) may all be provided in an LED component. Any of these combinations can thereby facilitate the direct attachment of an LED die to a lead frame.

Die Attach Layer Configuration

Various embodiments that now will be described configure the die attach layer itself to facilitate the direct electrical connection of the outer face of the anode contact to the exposed portion of the metal anode pad and the direct electrical connection of the outer face of the cathode contact to the exposed portion of the metal cathode pad, by the die attach layer. In the embodiments that will now be described, the die attach layer may be configured by (a) configuring the thickness thereof and/or by (b) configuring the composition thereof. Either or both of these configurations can facilitate the direct die attach of an LED die to a lead frame. Moreover, either or both of these configurations may be combined with any combination of one or more of the three configurations that were described above in connection with the metal pads and/or plastic cup.

(a) Configuring the Thickness of the Die Attach Layer

As was described above, due to the flexibility of the lead frame package, the metal anode pad 220 and the metal cathode pad 230 deviate from coplanarity. Thus, as shown in FIG. 18, there may be a height difference H between the adjacent ends 220a, 230a, respectively, thereof. Conventionally, die attach layers having a thickness of 3 μm or less are generally used for die attaching an LED die to a ceramic or other nonflexible substrate.

Various embodiments that now will be described may arise from recognition that a conventional die attach thickness may not be sufficient to allow an LED die to be die attached across these uneven surfaces with high component yield. In sharp contrast, various embodiments described herein and as illustrated in FIG. 18, provide a die attach layer 180' that is thicker than the height difference H between the metal anode pad 220 and the metal cathode pad 230. Specifically, referring to FIG. 18, the exposed portions 220e and 230e of the metal anode pad 220 and the method cathode pad 230, respectively, deviate from coplanarity by a height difference H. In some embodiments, H is measured at the adjacent ends 220a, 230a of the metal anode pad and metal cathode pad 220, 230, respectively. In other embodiments, the deviation from planarity H may be measured at other places on the metal pads.

As illustrated in FIG. 18, the die attach layer 180' has a thickness T that is thicker than the height difference H. Thus, T>H. In other embodiments, as illustrated in FIG. 19, T is also thicker than 3 μm. Thus, in FIG. 19, the die attach layer 180' has a thickness T greater than the height difference H that was illustrated in FIG. 18 and that is also greater than 3 μm.

In a specific example, it may be difficult to bond an LED die 100 having a 3 μm die attach layer 180 thereon, across two floating metal pads 220, 230 having a 4 μm height difference H, with high process yield. The LED die may be tilted and/or the die attach may fail during subsequent fabrication or use. In sharp contrast, when the thickness T of the die attach layer 180' is increased to be greater than the height difference H, high process yields may be provided during die attach. Other experiments have found a 5 μm height difference between the two pads, so that a die attach thickness of at least 5 μm may be used.

FIG. 20 illustrates a conventional LED die that is used for die attach to a ceramic or other nonflexible submount. As shown in FIG. 20, the thickness T of the conventional die attach layer 180 is less than 3 μm.

Figure 21:
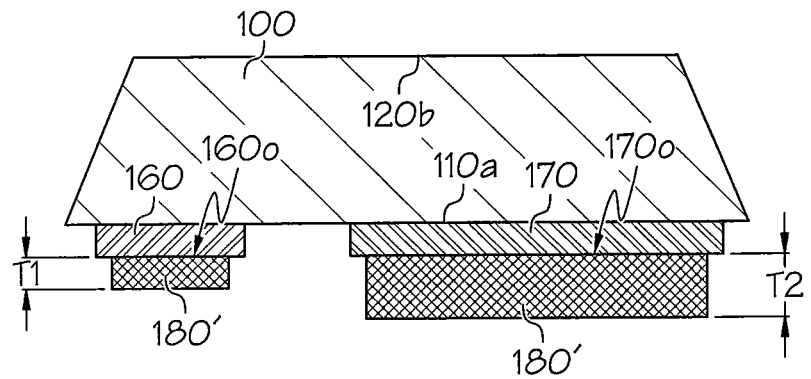
FIG. 21 is a cross-sectional view of an LED die according to various embodiments described herein.

FIG. 21 illustrates other embodiments wherein the die attach layer 180' is of different thickness on the outer face 160o of the anode contact 160 compared to on the outer face 170o of the cathode contact 170. Embodiments of FIG. 21 may arise from recognition that in some lead frames, the height difference H that was illustrated in FIG. 18 is often consistent from component to component. For example, as was illustrated in FIG. 18, the smaller metal anode pad 220 may consistently curve upward relative to the larger metal cathode pad 230. If this is the case, the thickness of the die attach layer 180' on the anode contact 160 may be made different than the thickness of the die attach layer 180' on the cathode contact 170. Thus, as illustrated in FIG. 21, in the configuration of FIG. 18, where the metal anode pad 220 is higher than the metal cathode pad 230, the die attach layer 180' on the cathode contact 170 may have a thickness T2 that is greater than the thickness T1 of the die attach layer 180' on the anode contact 160. Stated differently, T2>T1. Moreover, in some embodiments, the differences between the thicknesses may correspond to the height difference H, i.e., T2−T1=H. In yet other embodiments, T1 may also be at least 3 μm thick.

Accordingly, embodiments of FIGS. 18-19 and 21 can at least partially compensate for the height difference H between adjacent ends 220a, 230a of the lead frame metal anode and cathode pads 220, 230, respectively, by providing a die attach layer that is at least as thick as this height difference H. The die attach layer 180' may include ratios of AuSn (gold-tin), NiSn (nickel-tin) and/or other eutectic or non-eutectic mixtures of Au, Ni, Sn, Sb, As, Ta, Co, Mn and/or other 3d, 4d, 5d, or f block transition metals. Moreover, the thickness of the die attach material need not be uniform across the LED die. The die attach thickness may also be different as between the anode and cathode, to accommodate different relative heights of the bonding locations on the lead frame. Thus, thicker and/or asymmetric die attach layers may be provided.

(b) Die Attach Composition

Various embodiments described above varied the thickness of the die attach layer, but may use a conventional binary die attach layer. Various embodiments that will now be described use a ternary solder comprising Gold (Au), Nickel (Ni) and Tin (Sn). This ternary die attach composition may be used separately, may be used with the die attach thickness described above and/or may be used with any or all of the configurations of the metal anode pad, metal cathode pad and/or the plastic cup that were described above. It will be understood that the term "ternary" also includes quaternary and higher order combinations of metals in the die attach layer. Eutectic or non-eutectic combinations may be provided.

Various weight percent (wt %) ranges of the Au, Ni and Sn may be provided according to various embodiments described herein, as is illustrated in the following Table:

TABLE

| Ranges of Solder Compositions (wt %) | | |
|---|---|---|
| Au | Ni | Sn |
| 0 < Au ≤ 10 | 10 ≤ Ni ≤ 60 | 40 ≤ Sn ≤ 90 |
| 0.8 ≤ Au ≤ 4.5 | 19 ≤ Ni ≤ 41 | 55 ≤ Sn ≤ 80 |

Note in the above Table, all of the ranges are expressed in weight percent (wt %) and, in a specific composition of the solder, all of the wt %s need to add up to 100 wt % (unless other materials are also included).

Ternary solder compositions according to various embodiments described herein may have at least two desirable properties to facilitate direct die attach to lead frames. These two properties relate to low melting temperature and different melting and re-melting temperatures.

As to melting temperature, the ternary die attach materials described in the above Table have an initial melting temperature of between 250° C. and 260° C. In sharp contrast, Au—Sn solders that are conventionally used in the LED industry have a melting point of 282° C. This melting temperature of 250° C.-260° C. is less than the decomposition temperature of silicone (for example, 350° C.).

Moreover, ternary solder compositions according to various embodiments described herein have a re-melting temperature that is higher than the initial melting temperature (also simply referred to as the "melting temperature"). Specifically, the ternary solder compositions may not re-melt until at least 400° C., and in some embodiments at 485° C. In sharp contrast, conventional Au—Sn solders will re-melt again at their melting point of 282° C. after cycling.

Thus, solder compositions according to various embodiments described herein can provide an initial melt interval at a low temperature, but can form phases of a significantly higher temperature upon solidification that enables them to survive (i.e., not re-melt) during typical lead-free reflow processes that are used to attach an LED component to a board. Accordingly, ternary solders according to various embodiments described herein can achieve low melting temperatures (below 260° C.), which allows die attachment in lead frames that are prone to melting, such as silicone lead frames. Moreover, the composition will not re-melt when re-exposed to typical lead-free reflow profiles, which can ensure the integrity of the electrical and thermal contacts. Accordingly, the die attach material will not re-melt when subject to attaching the finished component to a board. Re-melting at this point may compromise the bond integrity and can lead to failure.

Figure 22:
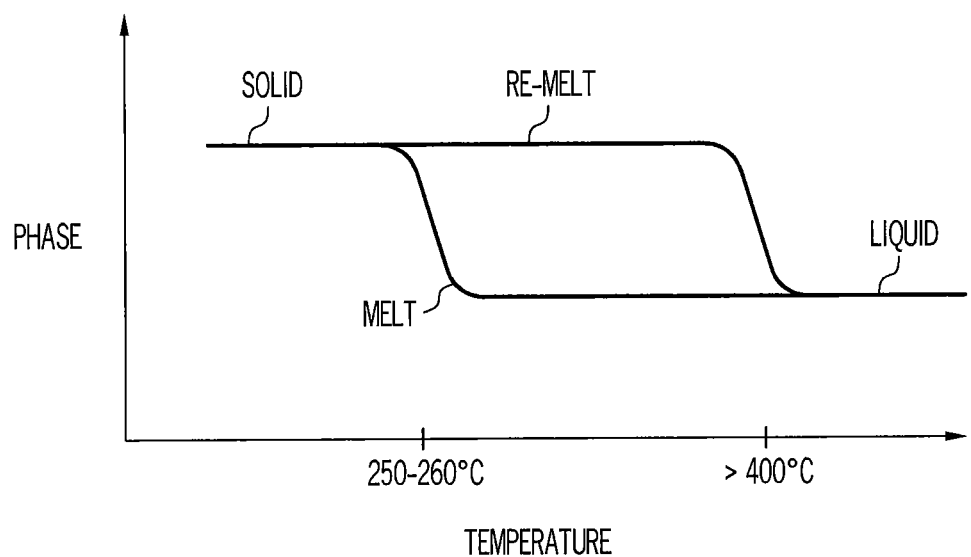
FIG. 22 is a phase diagram illustrating performance of die attach materials according to various embodiments described herein during melting and re-melting.

FIG. 22 is a phase diagram illustrating properties of ternary Au Ni Sn solder compositions according to various embodiments described herein during melting and re-melting. As shown in FIG. 22, initial melting takes place between 250° C. and 260° C. However, subsequent re-melting takes place at temperatures greater than 400° C.

Having been made aware of the desirable characteristics of the die attach material described above, those skilled in the art may envision quaternary modifications and/or additional ternary solders that may also provide these characteristics.

Fabrication

Figure 23:
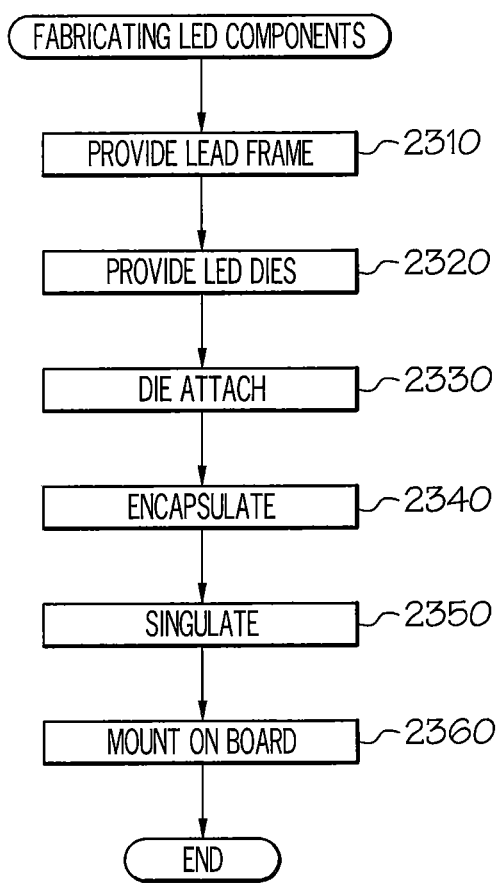
FIG. 23 is a flowchart of operations that may be performed to fabricate LED components according to various embodiments described herein.
Figure 24:
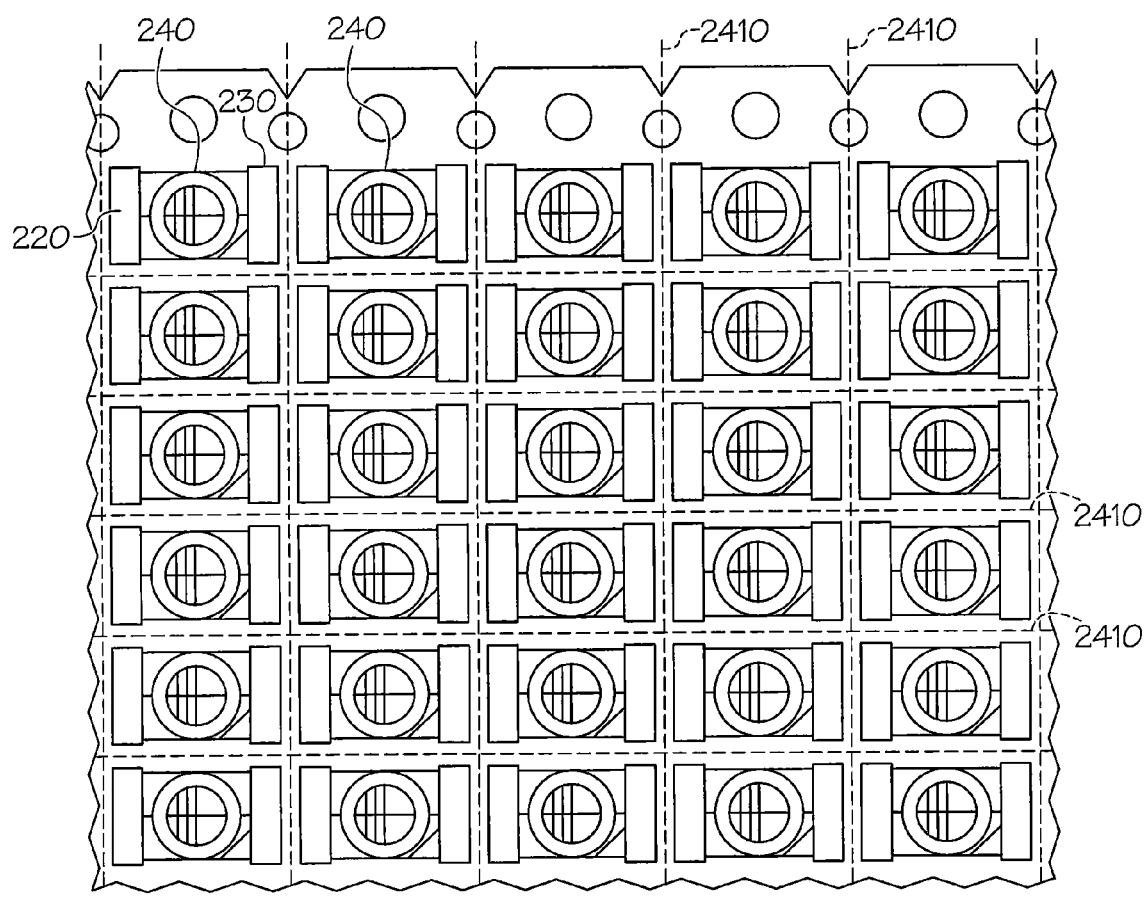
FIG. 24 illustrates a lead frame structure that can be used to fabricate a plurality of LED components, according to various embodiments described herein.

FIG. 23 is a flowchart of operations that may be performed to fabricate LED components according to various embodiments described herein. Referring to FIG. 23, at Block 2310, a lead frame structure is provided. A lead frame structure that may be used according to various embodiments described herein is illustrated in FIG. 24. An individual lead frame comprises a metal anode pad, a method cathode pad and a plastic cup on the metal anode pad and the metal cathode pad that defines an exposed portion of the metal anode pad and an exposed portion of the metal cathode pad. The metal anode pad, the metal cathode pad and/or the plastic cup may be configured according to any of the embodiments described above. The lead frame structure may be provided as an array of individual lead frames, so that multiple components may be fabricated together.

At Block 2320, LED dies are provided. As was described above, each LED die comprises first and second opposing faces, an anode contact and a cathode contact on the first face thereof, and a die attach layer on the outer faces of the anode and cathode contacts remote from the LED die. The die attach layer may be configured according to any of the embodiments described above.

It will be understood that operations of Block 2310 may be performed by a lead frame fabricator and operations at Block 2320 may be provided by an LED die manufacturer. These manufacturers may be same or different entities using the same or different fabrication facilities. Generally, LED die manufacture is more high-tech than lead frame manufacture.

At Block 2330, die attach is performed. Specifically, as was described above, the LED die is placed in the cup, such that the die attach layer is directly on the exposed portion of the metal anode pad and the exposed portion of the metal cathode pad. The die attach layer is then melted so that the die attach layer directly electrically connects the outer face of the anode contact to the exposed portion of the metal anode pad and directly electrically connects the outer face of the cathode contact to the exposed portion of the metal cathode pad. Encapsulation may be performed at Block 2340. The LED components are then singulated at Block 2350, for example using punching along the lines 2410 of FIG. 24. The singulated LED components are then mounted on a board at Block 2360.

CONCLUSION

Various embodiments described herein can directly die attach an LED die to a lead frame by configuring a metal anode pad, a metal cathode pad, a plastic cup and/or a die attach material, according to various embodiments described herein. These embodiments may be used in various combinations and subcombinations to allow low cost lead frames to be used with direct attach LED dies.

Various embodiments described herein may also include a layer comprising luminophoric material, also referred to as a phosphor layer. In some embodiments, the phosphor layer is a conformal phosphor layer that may be less than 150 μm thick in some embodiments, less than 100 μm thick in other embodiments and less than 50 μm thick in yet other embodiments. It will be understood that the term "phosphor" is used herein to denote any wavelength conversion material, and may be provided according to various configurations. The phosphor layer may also be any type of functional layer or layers, such as any layer disposed to affect the properties of the emitted light, for example, color, intensity and/or direction.

Various techniques may be used to apply the phosphor layer, including dispensing, screen printing, film transfer, spraying, coating and/or other techniques. Phosphor preforms also may be applied. In some embodiments, the phosphor layer may comprise silicone and/or other transparent material having phosphor particles therein. It will also be understood that the phosphor layer may be coplanar with the outer face of the LED dies. However, the outer or edge portions of the phosphor layer need not be co-planar with these outer faces. Specifically, it can be recessed from the outer faces or may protrude beyond the anode and cathode contacts.

The phosphor layer may be a thin conformal layer having uniform phosphor particle density. However, a phosphor layer may be provided that comprises phosphor particles that are nonuniformly dispersed therein, and that, in some embodiments, may include a phosphor-free region at the exterior surfaces of the phosphor layer. Moreover, the phosphor layer may also be configured as a conformal layer.

The phosphor layer, or any wavelength conversion layer, converts a portion of the light emitted from the LED die to a different wavelength, a process that is known in the art. One example of this process, is converting a portion of blue-emitted light from light emitter, such as an LED die, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and reemits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}Re_xO_{12}$:Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and reemit red light. First and second phosphors can also be combined for higher CRI white (i.e., warm white) with the yellow phosphors above combined with red phosphors. Various red phosphors can be used including:

$Sr_xCa_{1-x}S$:Eu,Y; Y=halide;
$CaSiAlN_3$:Eu; or
$Sr_{2-y}Ca_ySiO_4$:Eu.

Other phosphors can be used to create saturated color emission by converting all light to a particular color. For example, the following phosphors can be used to generate great saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
  $(Sr,Ca,Ba)(Al,Ga)_2S_4$:$Eu^{2+}$
  $Ba_2(Mg,Zn)Si_2O_7$:$Eu^{2+}$
  $Gd_{0.46}Sr_{0.31}Al_{1.23}O_xF_{1.38}$:$Eu^{2+}_{0.6}$
  $(Ba_{1-x-y}Sr_xCa_y)SiO_4$:Eu
  $Ba_2SiO_4$=$Eu^{2+}$
Red
  $Lu_2O_3$=$Eu^{3+}$
  $(Sr_{2-x}La_x)(Ce_{1-x}Eu_x)O_4$
  $Sr_2C_{1-x}Eu_xO_4$
  $SrTiO_3$:$Pr^{3+}$, $GA^{3+}$
  $CaAlSiN_3$I$Eu^{2+}$
  $Sr_2Si_5N_8$=$Eu^{2+}$ In some embodiments, the layer comprising luminophoric material and/or the encapsulant may also provide a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the LED die is configured to emit blue light, for example light having a dominant wavelength of 450-460 nm, and the phosphor layer comprises yellow phosphor, such as YAG:Ce phosphor, having a peak wavelength of 550 nm. In other embodiments, the LED die is configured to emit blue light upon energization thereof, and the phosphor layer may comprise a mixture of yellow phosphor and red phosphor, such CASN-based phosphor. In still other embodiments, the LED die is configured to emit blue light upon energization thereof, and the phosphor layer may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor. In embodiments which do use a phosphor, it may be beneficial to provide a uniform coating in order to provide more uniform emissions.

The encapsulant, which may also be referred to herein as "optical coupling material", may comprise silicone without phosphor particles therein, and may provide a primary optic for the light emitting device. The optical coupling material that is free of phosphor may be shaped to provide a lens, dome and/or other optical component, so that the sides and/or tops thereof may be oblique to the diode region. The optical coupling material that is free of phosphor may also encapsulate the phosphor layer and/or light emitting surfaces of the LED die. The optical coupling layer may be at least 1.5 mm thick in some embodiments, at least 0.5 mm thick in other embodiments, and at least 0.01 mm thick in yet other embodiments, and may not be present in still other embodiments. Thus, in other embodiments, an optical coupling material layer may be used without a phosphor layer. For example, the optical coupling material may be directly on the second face of the LED die. In some embodiments, a relatively thick transparent layer may be used. In other embodiments, a conformal transparent layer may be used. In still other embodiments, the transparent layer may be provided on a phosphor layer that comprises phosphor particles that are non-uniformly dispersed therein. The device may further include an additional encapsulant or lens, which may be silicone or glass. Other embodiments may not include this additional lens.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) component comprising:
a lead frame that comprises a metal anode pad, a metal cathode pad and a plastic cup on the metal anode pad and the metal cathode pad that defines an exposed portion of the metal anode pad and an exposed portion of the metal cathode pad in an interior of the plastic cup, the plastic cup comprising:
a plastic cup wall on a first face of the metal anode pad and a first face of the metal cathode pad to define the exposed portion of the metal anode pad and the exposed portion of the metal cathode pad in the interior of the plastic cup, and extending away from the metal anode pad and the metal cathode;
a plastic cup base on a second face of the metal anode pad and a second face of the metal cathode pad that are opposite the first face and extending in a direction of the metal anode pad and the metal cathode pad to define an exposed portion of the second face of the metal anode pad and an exposed portion of the second face of the metal cathode pad to an exterior of the plastic cup; and
a plastic cup opening remote from the plastic cup base;
an LED die that comprises first and second opposing faces and an anode contact and a cathode contact on the first face thereof, the anode and cathode contacts including outer faces remote from the LED die, the LED die being disposed in the plastic cup such that the outer face of the anode contact is adjacent the plastic cup base and spaced apart from the exposed portion of the metal anode pad, and the outer face of the cathode contact is adjacent the plastic up base and spaced apart from the exposed portion of the metal cathode pad; and
a die attach layer that extends between the outer face of the anode contact and the exposed portion of the metal anode pad and between the outer face of the cathode contact and the exposed portion of the metal cathode pad and that directly electrically connects the outer face of the anode contact to the exposed portion of the metal anode pad and directly electrically connects the outer face of the cathode contact to the exposed portion of the metal cathode pad.

2. The LED component according to claim 1 wherein the exposed portions of the metal anode and cathode pads are not coplanar.

3. The LED component according to claim 1 wherein the plastic cup comprises silicone.

4. The LED component according to claim 1 wherein the metal anode pad, the metal cathode pad and/or the plastic cup are configured to facilitate the direct electrical connection of the outer face of the anode contact to the exposed portion of the metal anode pad and the direct electrical connection of the outer face of the cathode contact to the exposed portion of the metal cathode pad, by the die attach layer.

5. The LED component according to claim 4 wherein adjacent ends of the metal anode pad and the metal cathode pad define a gap therebetween, wherein the plastic cup extends in the gap and also extends beyond non-adjacent ends of the metal anode pad and the metal cathode pad by a distance, and wherein the distance is larger than the gap.

6. The LED component according to claim 5 wherein the distance is at least 10% larger than the gap.

7. The LED component according to claim 4 wherein adjacent ends of the metal anode pad and the metal cathode pad have different widths.

8. The LED component according to claim 4 wherein the lead frame further comprises a metal link that mechanically connects the metal anode pad to the metal cathode pad outside the plastic cup.

9. The LED component according to claim 8 wherein the metal link is configured to be sheared from the metal anode pad and/or the metal cathode pad.

10. The LED component according to claim 8 wherein the metal link comprises a fusible metal.

11. The LED component according to claim 4 wherein adjacent ends of the metal anode pad and the metal cathode pad include curved facing surfaces.

12. The LED component according to claim 11 wherein the curved facing surfaces comprise a plurality of line segments that form oblique and/or orthogonal angles therebetween.

13. The LED component according to claim 12 wherein the LED die is a first LED die disposed in the plastic cup such that the outer face of the anode contact is adjacent the plastic cup base and spaced apart from the metal anode pad adjacent a first one of the line segments, and the outer face of the cathode contact is adjacent the plastic cup base and spaced apart from the metal cathode pad adjacent the first one of the line segments;
the LED component further comprising a second LED die that also comprises first and second opposing faces and an anode contact and a cathode contact on the first face thereof, the anode and cathode contacts including outer faces remote from the second LED die, the second LED die being disposed in the plastic cup such that the outer face of the anode contact is adjacent the plastic cup base and spaced apart from the metal anode pad adjacent a second one of the line segments, and the outer face of the cathode contact is adjacent the plastic cup base and spaced apart from the metal cathode pad adjacent the second one of the line segments.

14. The LED component according to claim 4 wherein the metal anode pad includes a metal finger that extends toward the metal cathode pad and wherein the metal cathode pad includes a metal finger that extends toward the metal anode pad.

15. The LED component according to claim 4 wherein one of the metal anode pad or the metal cathode pad includes three edges and the other of the metal cathode pad or the metal anode pad extends adjacent the three edges.

16. The LED component according to claim 4 wherein one of the metal anode pad or the metal cathode pad includes four edges and the other of the metal cathode pad or the metal anode pad extends adjacent the four edges.

17. The LED component according to claim 1 wherein the die attach layer is configured to facilitate the direct electrical connection of the outer face of the anode contact to the exposed portion of the metal anode pad and the direct electrical connection of the outer face of the cathode contact to the exposed portion of the metal cathode pad, by the die attach layer.

18. The LED component according to claim 17:
wherein the exposed portions of the metal anode and cathode pads deviate from coplanarity by a height difference, and
wherein the die attach layer is thicker than the height difference.

19. The LED component according to claim 18 wherein the die attach layer is also thicker than 3 μm.

20. The LED component according to claim 17 wherein the die attach layer is of different thickness between the outer face of the anode contact that is spaced apart from the exposed portion of the metal anode pad compared to between the outer face of the cathode contact that is spaced apart from the exposed portion of the metal cathode pad.

21. The LED component according to claim 17 wherein the die attach layer comprises a solder comprising Gold (Au), Nickel (Ni) and Tin (Sn).

22. The LED component according to claim 21 wherein 0<Au wt %≤10, 10≤Ni wt %≤60 and 40≤Sn wt %≤90.

23. The LED component according to claim 22 wherein 0.8≤Au wt %≤4.5, 19≤Ni wt %≤41 and 55≤Sn wt %≤80.

24. The LED component according to claim 17 wherein the plastic cup comprises silicone and wherein the die attach layer has a melting temperature below a decomposition temperature of the silicone.

25. The LED component according to claim 17 wherein the die attach layer has a melting temperature below 260° C.

26. The LED component according to claim 17 wherein the die attach layer has a melting temperature and has a re-melting temperature that is higher than the melting temperature.

27. The LED component according to claim 26 wherein the melting temperature is below 260° C. and the re-melting temperature is above 260° C.

* * * * *